(12) United States Patent
Lee et al.

(10) Patent No.: US 10,978,675 B2
(45) Date of Patent: Apr. 13, 2021

(54) DISPLAY DEVICE SOLIDIFIED AGAINST EXTERNAL IMPACT

(71) Applicant: SAMSUNG DISPLAY CO., LTD., Yongin-si (KR)

(72) Inventors: Sunhee Lee, Yongin-si (KR); Sunho Kim, Yongin-si (KR); Juchan Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/286,039

(22) Filed: Feb. 26, 2019

(65) Prior Publication Data

US 2019/0267573 A1    Aug. 29, 2019

(30) Foreign Application Priority Data

Feb. 28, 2018    (KR) .......................... 10-2018-0024729

(51) Int. Cl.
*H01L 51/52* (2006.01)
*H01L 27/32* (2006.01)
*H01L 27/12* (2006.01)

(52) U.S. Cl.
CPC ...... *H01L 51/5256* (2013.01); *H01L 27/1248* (2013.01); *H01L 27/3246* (2013.01); *H01L 27/3248* (2013.01); *H01L 27/3258* (2013.01); *H01L 27/3262* (2013.01); *H01L 27/3265* (2013.01); *H01L 27/3276* (2013.01); *H01L 51/5218* (2013.01); *H01L 51/5234* (2013.01)

(58) Field of Classification Search
CPC ............. H01L 51/5256; H01L 27/1248; H01L 27/3246; H01L 27/3248; H01L 27/3258; H01L 27/3262; H01L 27/3265; H01L 27/3276; H01L 51/5218; H01L 51/5234
USPC ....................................... 257/40; 438/82, 99
See application file for complete search history.

(56) References Cited

U.S. PATENT DOCUMENTS

| 8,237,165 B2 | 8/2012 | Kim et al. | |
| 9,881,938 B2 | 1/2018 | Park | |
| 2010/0012850 A1* | 1/2010 | Miura | A61B 5/0059 250/372 |
| 2012/0012850 A1 | 1/2012 | Kim et al. | |

(Continued)

FOREIGN PATENT DOCUMENTS

| KR | 1020100130898 | 12/2010 |
| KR | 1020140077624 | 6/2014 |

(Continued)

OTHER PUBLICATIONS

European Search Report dated Jul. 18, 2019 in corresponding European Application No. 19159765.7 (7 pages).

*Primary Examiner* — Didarul A Mazumder
(74) *Attorney, Agent, or Firm* — F. Chau & Associates, LLC

(57) ABSTRACT

A display device which is solid against an external impact is provided. The display device includes: a substrate; a thin film transistor arranged over the substrate; a first organic insulating layer arranged over the thin film transistor; and a first crack induction layer located inside the first organic insulating layer. The first crack induction layer may include an inorganic insulating material and may not overlap the thin film transistor as viewed from a direction perpendicular to the substrate.

25 Claims, 11 Drawing Sheets

(56) References Cited

U.S. PATENT DOCUMENTS

| | | | |
|---|---|---|---|
| 2014/0061607 A1* | 3/2014 | You | H01L 27/3258 257/40 |
| 2014/0167006 A1 | 6/2014 | Kim | |
| 2015/0108452 A1* | 4/2015 | Park | H01L 51/5253 257/40 |
| 2015/0255740 A1* | 9/2015 | Nakada | H01L 51/5246 257/40 |
| 2016/0118451 A1 | 4/2016 | Youn et al. | |
| 2016/0204184 A1* | 7/2016 | Park | H01L 27/124 257/71 |
| 2016/0233280 A1 | 8/2016 | Cheng et al. | |
| 2016/0285017 A1* | 9/2016 | Liu | H01L 51/52 |
| 2016/0315284 A1 | 10/2016 | Jeon | |
| 2016/0365364 A1 | 12/2016 | Li et al. | |
| 2017/0023839 A1 | 1/2017 | Han et al. | |
| 2017/0025637 A1* | 1/2017 | Kim | H01L 51/5253 |
| 2017/0069701 A1 | 3/2017 | Cai | |
| 2018/0053816 A1 | 2/2018 | Choi et al. | |

FOREIGN PATENT DOCUMENTS

| | | | | |
|---|---|---|---|---|
| KR | 1020160047132 | | 5/2016 | |
| KR | 1020160127873 | | 11/2016 | |
| KR | 1020170032956 | | 3/2017 | |
| KR | 10-2017-0157583 | * | 11/2017 | H01L 51/52 |

* cited by examiner

DISPLAY DEVICE SOLIDIFIED AGAINST EXTERNAL IMPACT

CROSS-REFERENCE TO RELATED APPLICATION

This application claims the benefit under 35 U.S.C. § 119 of Korean Patent Application No. 10-2018-0024729, filed on Feb. 28, 2018, in the Korean Intellectual Property Office, the disclosure of which is incorporated by reference herein in its entirety.

TECHNICAL FIELD

Example embodiments of the present disclosure relate to a display device, and more particularly, to a display device which is solidified against an external impact.

DISCUSSION OF RELATED ART

A display device includes a display element and circuit units configured to control an electric signal applied to the display element. The circuit units include various elements such as capacitors and thin film transistors (TFTs).

The circuit units generate electric signals to control the display element such as to emit light or control brightness of the display element via various wirings.

When an external impact is applied to the display device, the circuit units may be damaged by the external impact, for example, a crack may occur within the circuit units.

SUMMARY

Example embodiments of the present disclosure include a display device which is solid against an external impact. However, it should be understood that the example embodiments described herein should be considered in a descriptive sense only and not for limitation of the disclosure.

According to an example embodiment of the present disclosure, a display device includes: a substrate; a thin film transistor arranged over the substrate; a first organic insulating layer arranged over the thin film transistor; and a first crack induction layer located inside the first organic insulating layer.

The first crack induction layer may not overlap the thin film transistor as viewed from a direction perpendicular to the substrate.

The first crack induction layer may include an inorganic insulating material.

The first crack induction layer may have an island shape as viewed from a direction perpendicular to the substrate.

A bottom surface of the first organic insulating layer in a direction to the substrate, and a bottom surface of the first crack induction layer in the direction to the substrate may be located on a same layer.

The thin film transistor may include a first element and a second element located over the first element, and an inorganic insulating layer may be arranged between the first element and the second element.

The first crack induction layer may be located over the inorganic insulating layer, and the first organic insulating layer may cover the inorganic insulating layer, the second element, and the first crack induction layer.

The first crack induction layer may be located on a wiring arranged on the inorganic insulating layer, and the first organic insulating layer may cover the inorganic insulating layer, the second element, the wiring and the first crack induction layer.

Only an insulating material or insulating materials may be arranged between the substrate and a portion of the wiring corresponding to the first crack induction layer.

The display device may further include an organic material layer arranged between the first crack induction layer and the wiring.

The wiring and the second element may include a same material, and strength of the second element may be less than that of the first element.

The display device may further include: an additional inorganic insulating layer covering the inorganic insulating layer and the second element, in which the first crack induction layer may be located over the additional inorganic insulating layer, and the first organic insulating layer may cover the additional inorganic insulating layer and the first crack induction layer.

A distance from the substrate to a top surface of the first crack induction layer may be greater than a distance from the substrate to a top surface of the second element.

The top surface of the second element may be farthest from the substrate among top surfaces of elements of the thin film transistor.

The display device may further include: a pixel electrode located on the first organic insulating layer and electrically connected to the thin film transistor; a second organic insulating layer located on the first organic insulating layer to cover an edge of the pixel electrode; and a second crack induction layer located inside the second organic insulating layer.

The second crack induction layer may not overlap the thin film transistor as viewed from a direction perpendicular to the substrate.

At least a portion of the second crack induction layer may overlap the first crack induction layer as viewed from a direction perpendicular to the substrate.

The second crack induction layer may include an inorganic insulating material.

The second crack induction layer may have an island shape as viewed from a direction perpendicular to the substrate.

According to an example embodiment of the present disclosure, a display device includes: a substrate; a thin film transistor arranged over the substrate; a first organic insulating layer arranged over the thin film transistor; a pixel electrode located over the first organic insulating layer and electrically connected to the thin film transistor; a second organic insulating layer located on the first organic insulating layer to cover an edge of the pixel electrode; and a crack induction layer located inside the second organic insulating layer.

The crack induction layer may not overlap the thin film transistor as viewed from a direction perpendicular to the substrate.

The crack induction layer may include an inorganic insulating material.

The crack induction layer may have an island shape as viewed from a direction perpendicular to the substrate.

According to an example embodiment of the present disclosure, a display device includes: a substrate; a pixel circuit arranged over the substrate, the pixel circuit including a thin film transistor and a capacitor; an organic insulating layer arranged over the pixel circuit; a crack induction layer located inside the organic insulating layer; and an organic light-emitting diode arranged over the organic insulating layer and electrically connected to the pixel circuit, in which the crack induction layer does not overlap the thin film transistor or the capacitor as viewed from a direction perpendicular to the substrate.

The crack induction layer may include an inorganic insulating material.

BRIEF DESCRIPTION OF THE DRAWINGS

These and/or other aspects will become apparent and more readily appreciated from the following description of example embodiments, taken in conjunction with the accompanying drawings in which.

Figure 1:
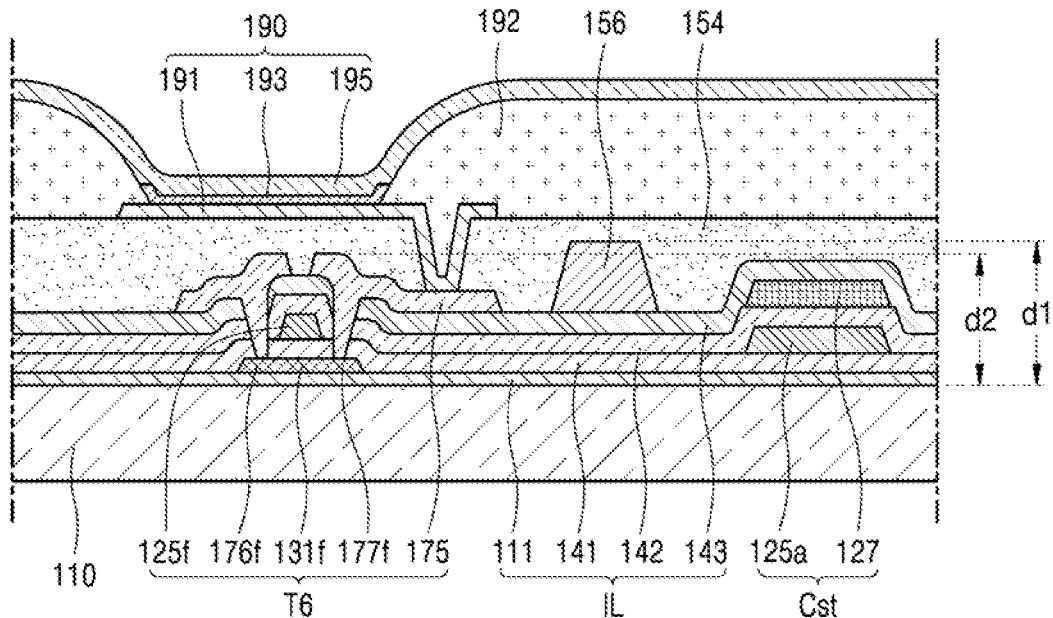
FIG. 1 is a cross-sectional view of a portion of a display device according to an example embodiment of the present disclosure.

Since the drawings in FIGS. 1-14 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

As the present disclosure allows for various changes and numerous embodiments, example embodiments will be illustrated in the drawings and described in detail in the written description. An effect and a characteristic of the present disclosure, and a method of accomplishing these will be apparent when referring to example embodiments described with reference to the accompanying drawings. This disclosure may, however, be embodied in many different forms and should not be construed as limited to the specific example embodiments set forth herein.

Hereinafter, the present disclosure will be described more fully with reference to the accompanying drawings, in which example embodiments of the present disclosure are shown. When description is made with reference to the drawings, like reference numerals in the drawings denote like or corresponding elements, and repeated description thereof will be omitted.

When a component, such as a layer, a film, a region, or a plate, is referred to as being "on" another component, it may be directly on the other component or intervening components may be present therebetween.

According to an example embodiment of the present disclosure, a display device which is solid against an external impact may be implemented. However, the scope of the present disclosure is not limited by this effect.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a cross-sectional view of a portion of a display device according to an example embodiment of the present disclosure. As illustrated in FIG. 1, the display device according to an example embodiment of the present disclosure includes a substrate 110. The substrate 110 may include various materials such as, for example, a glass material, a metal material, or a plastic material. The glass material for the substrate 110 may be a transparent glass material including silicon oxide ($SiO_2$). The metal material for the substrate 100 may be any suitable metal and may include but is not limited to: stainless steel, nickel (Ni), iron (Fe), Copper (Cu), aluminum (Al), chromium (Cr), manganese (Mg), titanium (Ti), molybdenum (Mo) or any combination thereof. The plastic material for the substrate 110 may include but is not limited to: polycarbonate (PC), polyimide (PI), polyethylene terephthalate (PET), or polyacrylate (PA). A pixel circuit including a thin film transistor T6 and a capacitor Cst, and an organic light-emitting diode 190 electrically connected thereto are located over the substrate 110. As required, a buffer layer 111 may be located on the substrate 110. The buffer layer 111 may planarize a surface of the substrate 110, or prevent penetration of impurities, oxygen, moisture, etc. to a semiconductor layer over the substrate 110. The buffer layer 111 may include a single/multi-layered structure including an inorganic insulating material such as, for example, silicon oxide ($SiO_2$), silicon nitride ($Si_3N_4$), silicon oxynitride (SiON), titanium oxide ($TiO_2$), or aluminum oxide ($Al_2O_3$).

A semiconductor layer including a source region 176f, a channel region 131f, and a drain region 177f may be located on the buffer layer 111. A first gate insulating layer 141 including an inorganic insulating material such as, for example, silicon nitride ($Si_3N_4$), silicon oxide ($SiO_2$), or silicon oxynitride (SiON) may be located on the semiconductor layer. Conductive layers such as a gate electrode 125f and a capacitor lower electrode 125a are located on the first gate insulating layer 141. Various conductive layers may be located on the first gate insulating layer 141. The various conductive layers including the gate electrode 125f and the capacitor lower electrode 125a located on the first gate insulating layer 141 may be collectively referred as first gate wirings. The first gate wirings may be simultaneously formed by using the same material. The material for the first gate wirings may include at least one of, for example, aluminum (Al), copper (Cu), titanium (Ti), tungsten (W), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), and the like.

A second gate insulating layer 142 may cover the first gate wirings. The second gate insulating layer 142 may include an inorganic insulating material such as, for example, silicon oxide ($SiO_2$), silicon nitride ($Si_3N_4$), or silicon oxynitride (SiON). A capacitor upper electrode 127 may be located on the second gate insulating layer 142. Various conductive layers may be located on the second gate insulating layer 142. The various conductive layers including the capacitor upper electrode 127 located on the second gate insulating layer 142 may be collectively referred to as second gate wirings. The second gate wirings may be simultaneously formed by using the same material. The material for the second gate wirings may include at least one of, for example, aluminum (Al), copper (Cu), titanium (Ti), tungsten (W), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), and the like.

An interlayer insulating layer 143 is located on the second gate wirings. The interlayer insulating layer 143 may include an inorganic insulating material such as, for example, silicon oxide ($SiO_2$), silicon nitride ($Si_3N_4$), silicon oxynitride (SiON) aluminum oxide ($Al_7O_3$), titanium oxide ($TiO_2$), tantalum oxide ($Ta_2O_5$), hafnium oxide ($HfO_2$), or zirconium oxide ($ZrO_2$). A drain electrode 175 may be located on the interlayer insulating layer 143, and may be connected to the semiconductor layer through contact holes in the first gate insulating layer 141 and the second gate insulating layer 142. Here, the drain electrode 175 may be called an intermediate connection layer which will be described further with reference to FIG. 9. Various conductive layers including the drain electrode 175 may be arranged on the interlayer insulating layer 143. Conductive layers located on the interlayer insulating layer 143 may be simultaneously formed by using the same material.

As described above, a thin film transistor T6 may include the semiconductor layer, the gate electrode 125*f*, and the drain electrode 175. The semiconductor layer may include the source region 176*f*, the channel region 131*f*, and the drain region 177*f*. Here, the gate electrode 125*f* may be referred to as a first element of the thin film transistor T6, and the drain electrode 175 may be referred to as a second element of the thin film transistor T6. Therefore, the inorganic insulating layers such as the second gate insulating layer 142 and the interlayer insulating layer 143 are arranged between the first element and the second element of the thin film transistor T6. The first gate insulating layer 141 may be arranged between the semiconductor layer and the first element of the thin film transistor T6.

A first organic insulating layer 154 is located on the thin film transistor T6. The first organic insulating layer 154 includes an organic material and may have an approximately flat top surface regardless of shapes of top surfaces of structures located thereunder. Therefore, the first organic insulating layer 154 may be referred to as a planarization layer. The first organic insulating layer 154 may include an organic material such as, for example, acrylic polymer, benzocyclobutene (BCB), polyimide (PI), or hexamethyldisiloxane (HMDSO). As illustrated in FIG. 1, a first crack induction layer 156 is located inside the first organic insulating layer 154. Thus, the first organic insulating layer 154 may cover the interlayer insulating layer 143, the second element, and the first crack induction layer 156. The first crack induction layer 156 may have an island shape as viewed from a direction perpendicular to the substrate 110.

When an external impact is applied while a display device is manufactured or while the display device is in use after being manufactured, a pixel circuit may be damaged by the external impact. Since an external impact is frequently applied on a screen on which an image is produced while the display device is in use, the pixel circuit may be damaged by the external impact. As illustrated in FIG. 1, since all of the buffer layer 111, the first gate insulating layer 141, the second gate insulating layer 142, and the interlayer insulating layer 143 include inorganic insulating materials, they may be referred to as inorganic insulating layers IL. When an external impact occurs, a crack may occur in the inorganic insulating layers IL. For example, the crack may occur in the inorganic insulating layers within the pixel circuit, thus the pixel circuit may be damaged by the external impact.

Since the first gate insulating layer 141 and the second gate insulating layer 142 including an inorganic material are arranged between the gate electrode 125*f* and the drain electrode 175, when an external impact is applied to the first gate insulating layer 141 and the second gate insulating layer 142, a crack may occur in the first gate insulating layer 141 and the second gate insulating layer 142. When a crack occurs in a neighborhood of the gate electrode 125*f* and the drain electrode 175, the crack may serve as an electric communication path between the gate electrode 125*f* and the drain electrode 175. That is, a short-circuit may occur between the gate electrode 125*f* and the drain electrode 175 due to passage of an electric current along the crack. When the short-circuit occurs between the gate electrode 125*f* and the drain electrode 175, the short-circuit may cause a malfunction of the display device.

A display device according to the present example embodiment may effectively prevent a defect from occurring in a pixel circuit even when an external impact is applied. Specifically, in the case where an external impact is frequently applied on a screen on which an image is produced while the display device is in use, the display device according to the present example embodiment may effectively prevent a pixel circuit from being damaged even when the impact is applied. When an external impact is applied onto the screen, it means that the impact is applied in a direction from above, not a direction from below the substrate 110. Therefore, when the external impact is applied, the relevant impact is transferred first to the first crack induction layer 156 located inside the first organic insulating layer 154 before reaching the pixel circuit such as the thin film transistor T6 or the capacitor Cst. For example, the first crack induction layer 156 according to the present example embodiment of the present disclosure may be properly configured so as to allow the impact to reach the first crack induction layer 156 first before reaching the thin film transistor T6 or the capacitor Cst, and may also be configured to stay away from the thin film transistor T6 and the capacitor Cst such that the crack occurring in the vicinity of the first crack induction layer 156 does not affect the thin film transistor T6 and the capacitor Cst. Therefore, even when a crack occurs due to an external impact, since the crack occurs in the first crack induction layer 156 or vicinity thereof, the occurrence of a crack in the thin film transistor T6 or the capacitor Cst may be effectively prevented. Consequently, damage of the pixel circuit may be prevented.

The first crack induction layer 156 located inside the first organic insulating layer 154 may have a single/multi-layered structure including an inorganic insulating material such as, for example, silicon oxide ($SiO_2$), silicon nitride ($Si_3N_4$), or silicon oxynitride (SiON). Since the first crack induction layer 156 includes an inorganic insulating material, an impact transferred to the first organic insulating layer 154 from the (above) outside is transferred to the first crack induction layer 156 including an inorganic insulating material having a greater hardness than that of an organic material, instead of passing through the first organic insulating layer 154 including an organic material and being transferred to a portion under the first organic insulating layer 154. Therefore, even when a crack occurs inside the display device due to the impact transferred in this manner, the crack may occur in the first crack induction layer 156 or the crack may occur in the vicinity of the first crack induction layer 156. Accordingly, the occurrence of a crack in the thin film transistor T6 or the capacitor Cst may be effectively prevented so as not to damage the pixel circuit. As a result, the display device according to the present example embodiment may be solid against an external impact.

When the first crack induction layer 156 is located inside the first organic insulating layer 154, it may be understood that a bottom surface of the first organic insulating layer 154 in a direction to the substrate 110 and a bottom surface of the first crack induction layer 156 in the direction to the substrate 110 are located on the same layer. This configuration may be implemented by forming the first crack induction layer 156 on the interlayer insulating layer 143 and then forming the first organic insulating layer 154 such that the first organic insulating layer 154 covers the interlayer insulating layer 143, the drain electrode 175, and the first crack induction layer 156. For example, the bottom surface of the first organic insulating layer 154 and the bottom surface of the first crack induction layer 156 may be both located on a top surface of the interlayer insulating layer 143.

As viewed from a direction perpendicular to the substrate 110, the first crack induction layer 156 may not overlap the thin film transistor T6 or the capacitor Cst. As described above, even when a crack occurs inside the display device due to an external impact, the crack may occur in the first crack induction layer 156 or may occur in the vicinity of the first crack induction layer 156. Therefore, damage of the thin film transistor T6 or the capacitor Cst may be effectively prevented by arranging the first crack induction layer 156 at a location not overlapping the thin film transistor T6 or the capacitor Cst.

A distance d1 from the substrate 110 to a top surface of the first crack induction layer 156 may be greater than a distance d2 from the substrate 110 to a top surface of the drain electrode 175 which is the second element of the thin film transistor T6. Through this configuration, when an impact is applied in the direction to the substrate 110 from above, most of the impact may be transferred to the first crack induction layer 156 by allowing the relevant impact to reach the first crack induction layer 156 first before reaching the drain electrode 175. Through this configuration, the occurrence of a crack in the inorganic insulating layer located below the drain electrode 175 or the inorganic insulating layer located in the vicinity of the drain electrode 175 may be effectively prevented. This configuration is equally applied to example embodiments of the present disclosure and modifications below. Furthermore, the distance d1 from the substrate 110 to the top surface of the first crack induction layer 156 may be greater than a longest distance from among distances from the substrate 110 to top surfaces of elements covered by the first organic insulating layer 154.

A pixel electrode 191 may be located on the first organic insulating layer 154 and connected to the drain electrode 175 therebelow. The pixel electrode 191 may be a (semi)transparent electrode or a reflective electrode. In the case where the pixel electrode 191 is a (semi)transparent electrode, the pixel electrode 191 may include, for example, indium tin oxide (ITO), indium zinc oxide (IZO), zinc oxide (ZnO), indium oxide ($In_2O_3$), indium gallium oxide (IGO), or aluminum zinc oxide (AZO). In the case where the pixel electrode 191 is a reflective electrode, the pixel electrode 191 may include a reflective layer including at least one of, for example, silver (Ag), magnesium (Mg), aluminum (Al), platinum (Pt), palladium (Pd), gold (Au), nickel (Ni), neodymium (Nd), iridium (Ir), chromium (Cr), and a compound thereof, and a layer including ITO, IZO, ZnO, $In_2O_3$, IGO, or AZO. However, the present disclosure is not limited thereto. For example, the pixel electrode 191 may include various materials and may have a single/multi-layered structure. Various modifications may also be made on the pixel electrode.

A second organic insulating layer 192, which is a pixel-defining layer including an organic material, may be arranged on the first organic insulating layer 154. The second organic insulating layer 192 defines a pixel by including an opening corresponding to each sub-pixel, that is, an opening exposing at least a central portion of the pixel electrode 191. Also, the second organic insulating layer 192 prevents the occurrence of an arc at an edge of the pixel electrode 191 by increasing a distance between the edge of the pixel electrode 191 and an opposite electrode 195 over the pixel electrode 191. The second organic insulating layer 192 may include an organic material such as, for example, PI, acrylic polymer, or BCB.

An intermediate layer 193 of the organic light-emitting diode 190 may include a low molecular weight material or a polymer material. In the case where the intermediate layer 193 includes a low molecular weight material, the intermediate layer 193 may have a structure in which a hole injection layer (HIL), a hole transport layer (HTL), an emission layer (EML), an electron transport layer (ETL), an electron injection layer (EIL), etc. are stacked in a single or a composite configuration. In the case where the intermediate layer 193 includes a polymer material, the intermediate layer 193 may generally have a structure including an HTL and an EML, However, the present disclosure is not limited thereto. For example, the intermediate layer 193 may have various structures other than those described above.

The opposite electrode 195 is arranged in a display area DA to cover the display area DA. That is, the opposite electrode 195 may have one body over a plurality of organic light-emitting diodes 190 to correspond to a plurality of pixel electrodes 191. The opposite electrode 195 may be a (semi)transparent electrode or a reflective electrode. In the case where the opposite electrode 195 is a (semi)transparent electrode, the opposite electrode 195 may include a layer including a metal having a small work function, that is, at least one of, for example, lithium (Li), calcium (Ca), lithium fluoride/calcium (LiF/Ca), lithium fluoride/aluminum (LiF/Al), aluminum (Al), silver (Ag), magnesium (Mg), and a compound thereof, and a (semi)transparent conductive layer including at least one of, for example, ITO, IZO, ZnO, and $In_2O_3$. In the case where the opposite electrode 195 is a reflective electrode, the opposite electrode 195 may include a layer including at least one of, for example, Li, Ca, LiF/Ca, LiF/Al, Al, Ag, Mg, and a compound thereof. However, the present disclosure is not limited thereto. For example, various modifications may be made on the configuration and the material of the opposite electrode 195.

Figure 2:
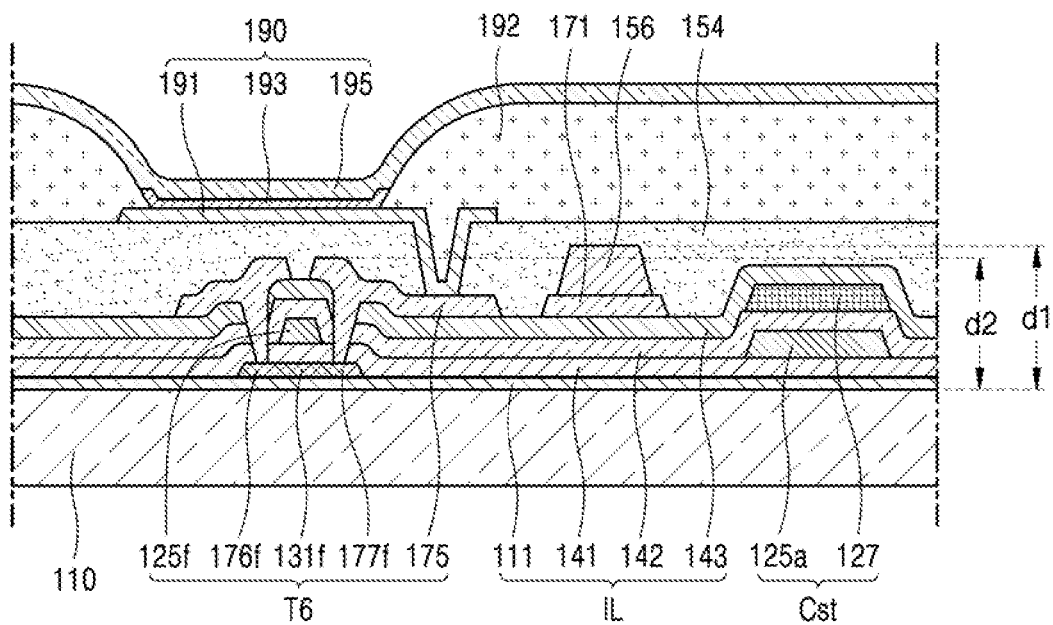
FIG. 2 is a cross-sectional view of a portion of a display device according to an example embodiment of the present disclosure.

Up to now, although description has been made to a case where the first crack induction layer 156 is located on the interlayer insulating layer 143, the present disclosure is not limited thereto. For example, as illustrated in FIG. 2, which is a cross-sectional view of a portion of a display device according to an example embodiment of the present disclosure, a wiring such as a data line 171 may be located on the interlayer insulating layer 143, and the first crack induction layer 156 may be located on the data line 171. Also, the first organic insulating layer 154 may cover the interlayer insulating layer 143, the drain electrode 175, the wiring and the first crack induction layer 156.

As described above, the display device according to the present example embodiment may effectively prevent the occurrence of a defect in a pixel circuit even when an external impact is applied to the display device. Specifically, when an external impact is frequently applied onto a screen which produces an image while the display device according to the present example embodiment is in use, damage of the pixel circuit may be effectively prevented even though the external impact is applied to the display device.

As described with reference to FIG. 1, since the first crack induction layer 156 includes an inorganic insulating material, an impact transferred to the first organic insulating layer 154 from the (above) outside is transferred to the first crack induction layer 156 including the inorganic insulating material having a greater hardness than that of an organic material, instead of passing through the first organic insulating layer 154 including an organic material and being transferred to a portion under the first organic insulating layer 154. Therefore, even when a crack occurs inside the display device due to the impact transferred in this manner, the crack may occur in the first crack induction layer 156 or may occur in the vicinity of the first crack induction layer 156. The first crack induction layer 156 according to the present example embodiment may be arranged at a location not overlapping the thin film transistor T6 or the capacitor Cst. Thus, according to the display device of the present example embodiment, even when a crack occurs inside the display device due to an external impact, the crack may occur in the first crack induction layer 156 or may occur in the vicinity of the first crack induction layer 156. Therefore, a crack in the thin film transistor T6 or the capacitor Cst may not occur, and a defect of the thin film transistor T6 or the capacitor Cst may be effectively prevented.

When a crack occurs in the first crack induction layer 156 or the vicinity thereof, the crack may occur in the data line 171 under the first crack induction layer 156. However, since most cracks occur in the first crack induction layer 156, the crack does not extend to an inorganic insulating layer below the data line 171, and thus a short-circuit between the data line 171 and another conductive layer does not occur. Furthermore, the data line 171 may not be short-circuited with another conductive layer even when a crack extends to the inorganic insulating layer below the data line 171 by arranging only an insulating material between the substrate 110 and a portion of the data line 171 corresponding to the first crack induction layer 156. The portion of the data line 171 corresponding to the first crack induction layer 156 may be the portion of the data line 171 overlapping the first crack induction layer 156 as viewed from a direction perpendicular to the substrate 110. On the other hand, a crack may only occur in the first crack induction layer 156 or the vicinity thereof and may not occur in the data line 171 under the first crack induction layer 156. However, by selecting a material with low strength for the data line 171 and allowing growth of the crack to extend to the data line 171, the growth of the crack may stop in the data line 171 and may not extend to the inorganic insulating layer below the data line 171. Here, when the data line 171 includes a material with low strength, the crack is easy to occur at the data line when an external impact is applied to the display device. Two or more insulating materials may be disposed between the portion of the data line 171 corresponding to the first crack induction layer 156 and the substrate 110, but not conductive materials.

For reference, though the first crack induction layer 156 may be located right on an insulating layer, in the case where lots of transistors and capacitors are located in one pixel, it may not be easy to find out a space in which the first crack induction layer 156 can be located. In this case, as described above, it may be considered to arrange the first crack induction layer 156 on the same wiring as the data line 171.

Even in the case illustrated in FIG. 2, a distance d1 from the substrate 110 to a top surface of the first crack induction layer 156 may be greater than a maximum distance d2 between the substrate 110 to a top surface of the drain electrode 175, which is the second element of the thin film transistor T6. Furthermore, the distance d1 from the substrate 110 to the top surface of the first crack induction layer 156 may be greater than a maximum distance among distances from the substrate 110 to top surfaces of elements covered by the first organic insulating layer 154.

Figure 3:
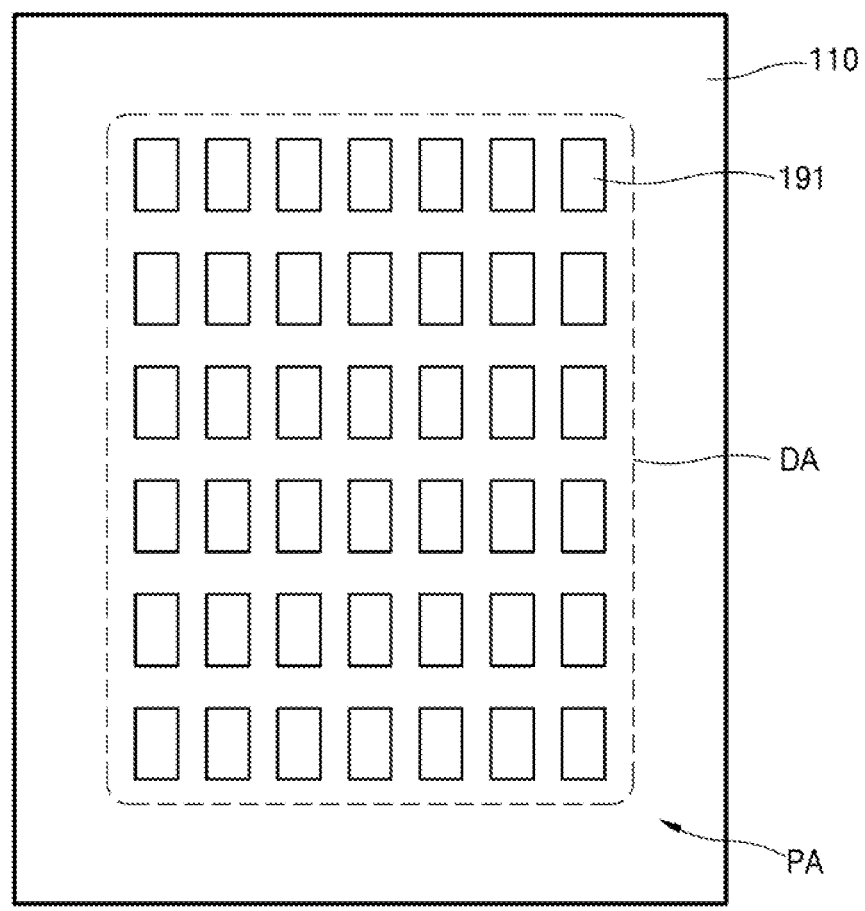
FIG. 3 is a plan view of a portion of a display device according to an example embodiment of the present disclosure.

FIG. 3 is a plan view of a portion of a display device according to an example embodiment of the present disclosure. As illustrated in FIG. 3, the display device according to the present example embodiment includes the substrate 110. As illustrated in FIG. 3, the substrate 110 of the display device according to the present example embodiment includes the display area DA and the peripheral area PA outside the display area DA. Various display elements such as organic light-emitting diodes may be arranged in the display area DA of the substrate 110. Various wirings configured to transfer an electric signal to be applied to the display area DA may be located in the peripheral area PA of the substrate 110. Hereinafter, for convenience of description, a display device including an organic light-emitting diode as a display element is described. However, the present disclosure is not limited thereto. For reference, FIG. 3 illustrates the plurality of pixel electrodes 191 located inside the display area DA, and the pixel electrodes 191 may be understood as corresponding to the display elements. The plurality of pixel electrodes 191 may be arranged in approximately a matrix form, but the present disclosure is not limited thereto. Also, the organic light-emitting diodes as display elements corresponding to the plurality of pixel electrodes 191 arranged in approximately a matrix form may display an image.

Figure 4:
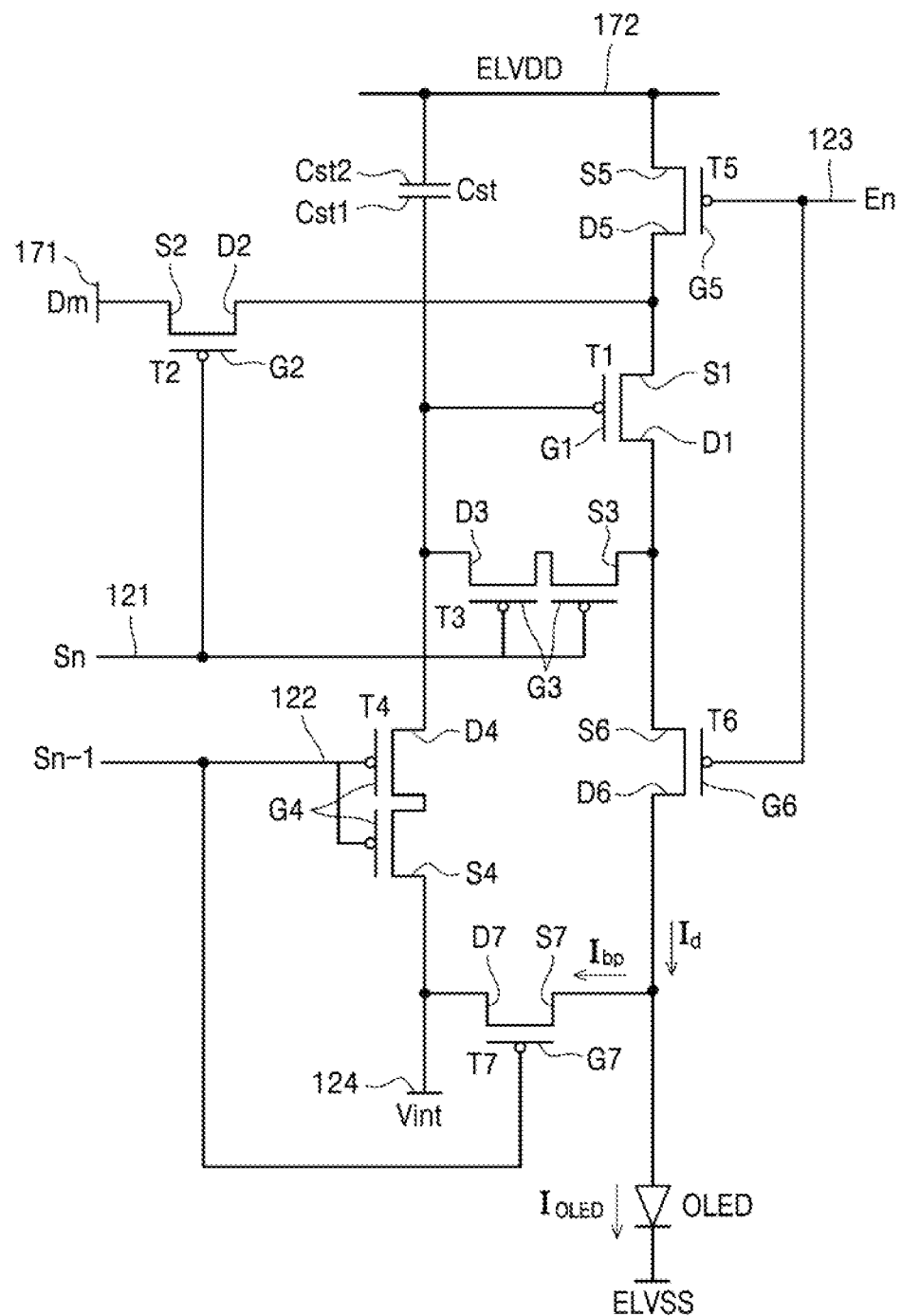
FIG. 4 is an equivalent circuit diagram of a (sub)pixel of the display device of FIG. 3.

FIG. 4 is an equivalent circuit diagram of a (sub)pixel of the display device of FIG. 3. FIG. 4 illustrates a case where a (sub)pixel includes an organic light-emitting diode. The display device includes a plurality of circuit units which respectively correspond to a plurality of pixel electrodes 191 and are respectively electrically connected to corresponding pixel electrodes 191. That is, FIG. 4 may be understood as an equivalent circuit diagram representing one circuit unit among the plurality of circuit units.

As illustrated in FIG. 4, one (sub)pixel of a display device according to an example embodiment of the present disclosure includes a plurality of thin film transistors T1, T2, T3, T4, T5, T6, and T7, a capacitor Cst, and an organic light-emitting diode OLED, and a plurality of (sub)pixels may be arranged in a matrix. The plurality of thin film transistors T1, T2, T3, T4, T5, T6, and T7 and the capacitor Cst may be understood as elements included in the above-described circuit unit. The circuit unit is electrically connected to a plurality of signal lines, for example, a scan line 121, a previous scan line 122, an emission control line 123, an initialization voltage line 124, and a data line 171, and power supply lines, for example, a lower power supply line 172 and an upper power supply line 178. The plurality of signal lines, that is, the scan line 121, the previous scan line 122, the emission control line 123, the initialization voltage line 124, and the data line 171, or the lower and upper power supply lines 172 and 178 may be electrically connected to a plurality of (sub)pixels.

The plurality of thin film transistors include a driving thin film transistor T1, a switching thin film transistor T2, a compensation thin film transistor T3, an initialization thin film transistor T4, an operation control thin film transistor T5, an emission control thin film transistor T6, and a bypass thin film transistor T7. In the display device according to the example embodiment described with reference to FIG. 1 or 2, it may be understood that the emission control thin film transistor T6 has been described as an element of the pixel circuit. When an external impact is frequently applied onto a screen which produces an image while the display device according to the example embodiment described with reference to FIG. 1 or 2 is in use, damage of the pixel circuit, for example, the emission control thin film transistor T6 as shown in FIG. 1 or 2, may be effectively prevented even though the external impact is applied to the display device.

The signal lines include the scan line 121 configured to transfer a scan signal Sn, the previous scan line 122 configured to transfer a previous scan signal Sn-1 to the initialization thin film transistor T4 and the bypass thin film transistor T7, the emission control line 123 configured to transfer an emission control signal En to the operation control thin film transistor T5 and the emission control thin film transistor T6, the data line 171 crossing the scan line 121 and configured to transfer a data signal Dm, and the initialization voltage line 124 configured to transfer an initialization voltage Vint initializing the driving thin film transistor T1. In addition to these signal lines, the lower power supply line 172 configured to transfer a driving voltage ELVDD and almost parallel to the data line 171, and the upper power supply line 178 located thereabove are arranged together with these signal lines. Each of the scan line 121, the previous scan line 122, the emission control line 123, the initialization voltage line 124, the data line |171|$_{[A1]}$, the lower power supply line 172 and the upper power supply line 178 may be connected to one (sub)pixel.

A gate electrode G1 of the driving thin film transistor T1 is connected to a capacitor lower electrode Cst1 of a capacitor Cst, a source electrode S1 of the driving thin film transistor T1 is connected to the lower power supply line 172 through the operation control thin film transistor T5, and the drain electrode D1 of the driving thin film transistor T1 is electrically connected to a pixel electrode of the organic light-emitting diode OLED through the emission control thin film transistor T6. The driving thin film transistor T1 receives a data signal Dm and supplies a driving current $I_d$ to the organic light-emitting diode OLED in response to a switching operation of the switching thin film transistor T2.

A gate electrode G2 of the switching thin film transistor T2 is connected to the scan line 121, a source electrode S2 of the switching thin film transistor T2 is connected to the data line 171, and a drain electrode D2 of the switching thin film transistor T2 is connected to the source electrode S1 of the driving thin film transistor T1 and electrically connected to the lower power supply line 172 through the operation control thin film transistor T5. The switching thin film transistor T2 performs a switching operation of being turned on in response to a scan signal Sn received through the scan line 121 and transferring a data signal Dm received through the data line 171 to the source electrode S1 of the driving thin film transistor T1.

A gate electrode G3 of the compensation thin film transistor 13 is connected to the scan line 121, a source electrode S3 of the compensation thin film transistor T3 is connected to the drain electrode D1 of the driving thin film transistor T1 and electrically connected to the pixel electrode of the organic light-emitting diode OLED through the emission control thin film transistor T6, and a drain electrode D3 of the compensation thin film transistor T3 is connected to the capacitor lower electrode Cst1 of the capacitor Cst, a drain electrode D4 of the initialization thin film transistor T4, and the gate electrode G1 of the driving thin film transistor T1. The compensation thin film transistor T3 is turned on in response to a scan signal Sn received through the scan line 121, and diode-connects the driving thin film transistor T1 by electrically connecting the gate electrode G1 of the driving thin film transistor T1 to the drain electrode D1 of the driving thin film transistor T1.

A gate electrode G4 of the initialization thin film transistor T4 is connected to a previous scan line 122, a source electrode S4 of the initialization thin film transistor T4 is connected to a drain electrode D7 of the bypass thin film transistor T7 and an initialization voltage line 124, and the drain electrode D4 of the initialization thin film transistor T4 is connected to the capacitor lower electrode Cst1 of the capacitor Cst, the drain electrode D3 of the compensation thin film transistor T3, and the gate electrode G1 of the driving thin film transistor T1. The initialization thin film transistor T4, which performs an initialization operation, is turned on in response to a previous scan signal Sn-1 received through the previous scan line 122 and initializes a voltage of the gate electrode G1 of the driving thin film transistor T1 by transferring an initialization voltage Vint to the gate electrode G1 of the driving thin film transistor T1. In this case, the compensation thin film transistor T3 and the initialization thin film transistor T4 are each configured to have a dual gate structure to cut off a leakage current.

A gate electrode G5 of the operation control thin film transistor T5 is connected to the emission control line 123, a source electrode S5 of the operation control thin film transistor T5 is connected to the lower power supply line 172, and a drain electrode D5 of the operation control thin film transistor T5 is connected to the source electrode S1 of the driving thin film transistor T1 and the drain electrode D2 of the switching thin film transistor T2.

A gate electrode G6 of the emission control thin film transistor T6 is connected to the emission control line 123, a source electrode S6 of the emission control thin film transistor T6 is connected to the drain electrode D1 of the driving thin film transistor T1 and the source electrode 83 of the compensation thin film transistor T3, and a drain electrode D6 of the emission control thin film transistor T6 is electrically connected to a source electrode S7 of the bypass thin film transistor T7 and the pixel electrode of the organic light-emitting diode OLED. The operation control thin film transistor T5 and the emission control thin film transistor T6 are simultaneously turned on in response to an emission control signal En transferred through the emission control line 123, and thus the driving voltage ELVDD, which is compensated by using the diode-connected driving transistor T1, is applied to the organic light-emitting diode OLED, and the driving current $I_d$ is allowed to flow to the organic light-emitting diode OLED.

A gate electrode G7 of the bypass thin film transistor T7 is connected to the previous scan line 122, a source electrode S7 of the bypass thin film transistor T7 is connected to the drain electrode D6 of the emission control thin film transistor T6 and the pixel electrode 191 (see FIG. 1, FIG. 2, etc.)

of the organic light-emitting diode OLED, and a drain electrode D7 of the bypass thin film transistor T7 is connected to the source electrode S4 of the initialization thin film transistor T4 and the initialization voltage line 124. The gate electrode G7 of the bypass thin film transistor T7 receives a previous scan signal Sn-1 transferred through the previous scan line 122. When an electric signal of a voltage having a preset level, which may turn off the bypass thin film transistor T7, is applied from the previous scan signal Sn-1, the bypass thin film transistor T7 is turned off and a portion of the driving current $I_d$ flows through the bypass thin film transistor T7 as a bypass current $I_{bp}$.

The seven-transistor and one-capacitor structure is illustrated in the example embodiment of the present disclosure above, but the present disclosure is not limited thereto. For example, the number of transistors and the number of capacitors may be variously changed.

When the organic light-emitting diode OLED emits light even though a minimum current of the driving thin film transistor T1, which displays a black image, flows as a driving current, the black image is not properly displayed. Here, the minimum current of the driving thin film transistor T1 denotes a current under a condition in which a gate-source voltage $V_{GS}$ of the driving thin film transistor T1 is less than a threshold voltage Vth and thus the driving thin film transistor T1 is turned off. Therefore, to prevent the organic light-emitting diode OLED from emitting light even when the minimum current flows as the driving current, the bypass thin film transistor T7 may distribute a portion of the driving current $I_d$ flowing from the driving thin film transistor T1 to another current path as the bypass current $I_{bp}$ besides a current path toward the organic light-emitting diode OLED. A black image is produced by transferring a current less than the minimum driving current (e.g. a current of about 10 pA or less), under the condition in which the driving thin film transistor TI is turned off, to the organic light-emitting diode OLED, and thus not allowing the organic light-emitting diode OLED to emit light or minimizing an emission degree.

In the case where a minimum driving current for displaying a black image flows, since the bypass current $I_{bp}$ branches from the minimum driving current, whether the organic light-emitting diode OLED emits light or an emission degree is greatly influenced. However, in the case where a large driving current for displaying an image such as a general image or a white image flows, an emission degree of the organic light-emitting diode OLED is nearly not influenced by the bypass current $I_{bp}$. Therefore, in the case where the driving current for displaying a black image flows, an emission current $I_{OLED}$ of the organic light-emitting diode OLED, which is reduced by an amount of the bypass current $I_{bp}$ from the driving current $I_d$, has a current at a level which may clearly express a black image, the bypass current $I_{bp}$ branching through the bypass thin film transistor T7. Therefore, a contrast ratio may be enhanced by producing an image having brightness corresponding to accurate black using the bypass thin film transistor T7.

Though FIG. 4 illustrates a case where the initialization thin film transistor T4 and the bypass thin film transistor T7 are connected to the previous scan line 122, the present disclosure is not limited thereto. For example, in an example embodiment of the present disclosure, the initialization thin film transistor T4 may be connected to the previous scan line 122 and thus driven in response to a previous scan signal Sn-1, and the bypass thin film transistor T7 may be connected to a separate wiring and thus driven in response to a signal transferred through the wiring.

A capacitor upper electrode Cst2 of the capacitor Cst is connected to the lower power supply line 172 and the driving voltage ELUDE), and the opposite electrode of the organic light-emitting diode OLED is connected to a common voltage ELVSS. Therefore, the organic light-emitting diode OLED may display an image by receiving the emission current $I_{OLED}$ from the driving thin film transistor T1 and emitting light.

Though FIG. 4 illustrates that the compensation thin film transistor T3 and the initialization thin film transistor T4 have a dual gate electrode. The present disclosure is not limited thereto. For example, in an example embodiment of the present disclosure, the compensation thin film transistor T3 and the initialization thin film transistor T4 may have one gate electrode. Also, at least one of other thin film transistors T1, T2, T5, T6, and T7 besides the compensation thin film transistor T3 and the initialization thin film transistor T4 may have a dual gate electrode. In addition, various other modifications may also be made.

Hereinafter, a specific operation of one pixel of the organic light-emitting display device is briefly described.

First, during an initialization period, a previous scan signal Sn-1 of a low level is supplied through the previous scan line 122. Then, the initialization thin film transistor T4 is turned on in response to the previous scan signal Sn-1 of the low level, the initialization voltage Vint from the initialization voltage line 124 is transferred to the gate electrode G1 of the driving thin film transistor T1 through the initialization thin film transistor T4, and thus the driving thin film transistor T1 is initialized by the initialization voltage Vint.

After that, during a data programming period, a scan signal Sn of a low level is supplied through the scan line 121. Then, the switching thin film transistor T2 and the compensation thin film transistor T3 are turned on in response to the scan signal Sn of the low level. Therefore, the driving thin film transistor T1 is diode-connected and forward-biased by the turned-on compensation thin film transistor T3. Then, a compensation voltage Dm+Vth (Vth has a (–) value) is applied to the gate electrode G1 of the driving thin film transistor T1, in which the compensation voltage Dm+Vth is reduced by a threshold voltage Vth of the driving thin film transistor T1 from a data signal Dm supplied through the data line 171. Also, the driving voltage ELVDD and the compensation voltage Dm+Vth are respectively applied to two opposite ends of the capacitor Cst, and a charge corresponding to a voltage difference between the two opposite ends is stored in the capacitor Cst.

After that, during an emission period, an emission control signal En supplied from the emission control line 123 is changed from a high level to a low level. Then, during the emission period, the operation control thin film transistor T5 and the emission control thin film transistor T6 are turned on in response to an emission control signal of a low level. Then, the driving current $I_d$ determined by a voltage difference between a voltage of the gate electrode G1 of the driving thin film transistor T1 and the driving voltage ELVDD occurs, and the driving current $I_d$ is supplied to the organic light-emitting diode OLED through the emission control thin film transistor T6. During the emission period, the gate-source voltage $V_{GS}$ of the driving thin film transistor T1 is maintained at '(Dm+Vth)-ELVDD' by the capacitor Cst. According to a current-voltage relation of the driving thin film transistor T1, since the driving current $I_d$ is proportional to '$(Dm-ELVDD)^2$', which is square of a value subtracted by the threshold voltage Vth from the gate-source voltage $V_{GS}$, the driving current $I_d$ is determined regardless of the threshold voltage Vth of the driving thin film transistor T1.

Hereinafter, a detailed structure of one (sub)pixel of the organic light-emitting display device illustrated in FIG. 4 is described with reference to FIGS. 5 to 10.

Figure 5:
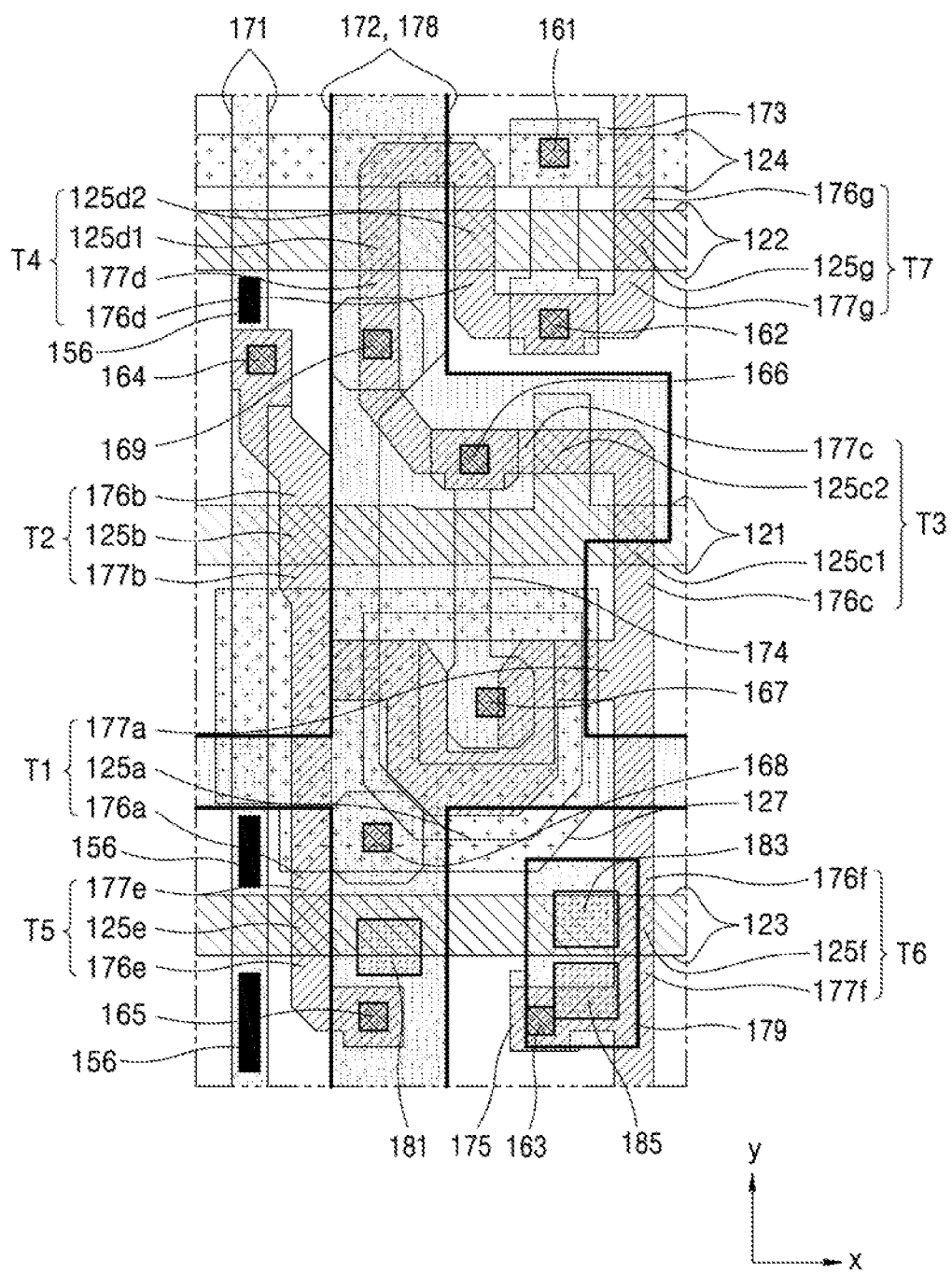
FIG. 5 is an arrangement view of locations of a plurality of thin film transistors, a capacitor, etc. of the (sub)pixel of FIG. 4.

FIG. 5 is an arrangement view of locations of a plurality of thin film transistors, a capacitor, etc. of the (sub)pixel of FIG. 4. For reference, the arrangement view illustrated in FIG. 4 is an arrangement view of one (sub)pixel, and (sub)pixels of the same/similar configuration may be arranged up/down/left/right. For example, a plurality of (sub)pixels may be arranged in a matrix. FIGS. 6 to 10 are arrangement views, on a layer basis, of elements such as the plurality of thin film transistors, the capacitor, etc. of FIG. 5. That is, each of FIGS. 6 to 10 illustrates an arrangement of a wiring, a semiconductor layer, etc. located in the same layer. An insulating layer may be arranged between layered structures illustrated in FIGS. 6 to 10. For example, the first gate insulating layer 141 (see FIG. 11) may be arranged between a layer illustrated in FIG. 6 and a layer illustrated in FIG. 7, the second gate insulating layer 142 (see FIG. 11) may be arranged between a layer illustrated in FIG. 7 and a layer illustrated in FIG. 8, and a first inorganic layer 151 (see FIG. 11) may be arranged between a layer illustrated in FIG. 9 and a layer illustrated in FIG. 10. For example, the first gate insulating layer 141 may be arranged between the semiconductor layer and the first gate wirings, the second gate insulating layer 142 may be arranged between the first gate wirings and the second gate wirings, and a first inorganic layer 151 may be arranged between the first conductive layers and the second conductive layer. A contact hole may be formed in these insulating layers, and the layered structures illustrated in FIGS. 6 to 10 may be electrically vertically connected to each other. As described above, the display device according to the present example embodiment includes a pixel circuit arranged in the display area DA and including conductive layers.

The display device according to the present example embodiment includes the scan line 121, the previous scan line 122, the emission control line 123, and the initialization voltage line 124 configured to respectively apply a scan signal Sn, a previous scan signal Sn-1, an emission control signal En, and an initialization voltage Vint, and provided in a row direction. Also, the display device according to the present example embodiment may include the data line 171 and the lower and upper power supply lines 172 and 178 crossing the scan line 121, the previous scan line 122, the emission control line 123, and the initialization voltage line 124, in which the data line 171 and the lower and upper power supply lines 172 and 178 may be configured to respectively apply a data signal Dm and the driving voltage ELVDD to a (sub)pixel. The (sub)pixel includes an organic light-emitting diode OLED and a circuit unit electrically connected thereto. The organic light-emitting diode OLED may include the pixel electrode 191, and the circuit unit may include the driving thin film transistor T1, the switching thin film transistor T2, the compensation thin film transistor T3, the initialization thin film transistor T4, the operation control thin film transistor T5, the emission control thin film transistor T6, the bypass thin film transistor T7, and the capacitor Cst.

The scan line 121, the previous scan line 122, the emission control line 123, and the initialization voltage line 124 may be electrically connected in common to circuit units of (sub)pixels arranged along the x axis. Likewise, another scan line 121, previous scan line 122, emission control line 123, and initialization voltage line 124 extending in the x axis direction may be located in a +y direction and a −y direction of FIG. 3. Also, the data line 171 and the lower and upper power supply lines 172 and 178 may be electrically connected in common to circuit units of (sub)pixels arranged along the y axis. Likewise, another data line 171 and other lower and upper power supply lines 172 and 178 extending in a y-axis direction may be located in a +x axis and −x axis direction of FIG. 3. That is, the display device according to the present example embodiment may include the plurality of scan lines 121, previous scan lines 122, emission control lines 123, initialization voltage lines 124, data lines 171, and lower and upper power supply lines 172 and 178. For example, the plurality of (sub)pixels may be arranged in a plurality of rows and a plurality of columns in a matrix.

Figure 6:
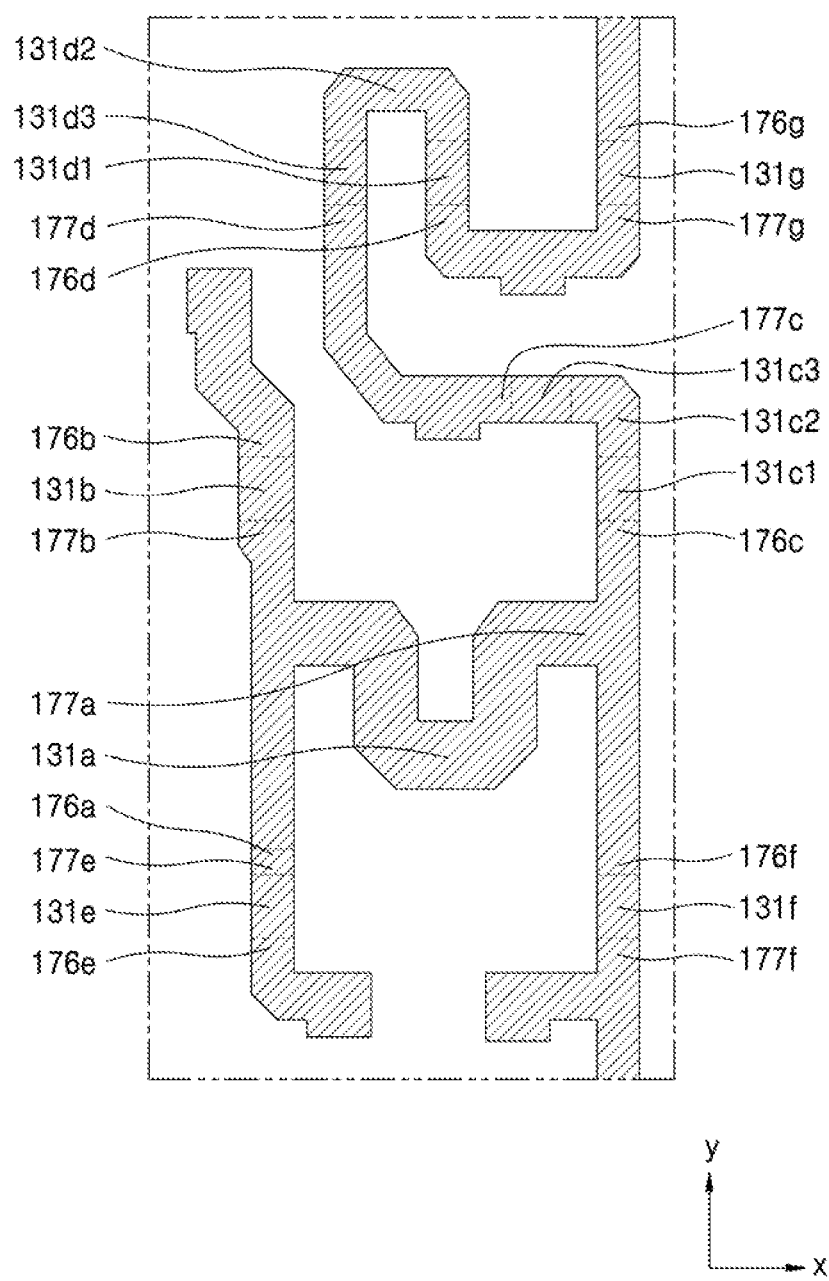
FIGS. 6 to 10 are arrangement views, on a layer bass, of elements such as the plurality of thin film transistors, the capacitor, etc. of FIG. 5.

The driving thin film transistor T1, the switching thin film transistor T2, the compensation thin film transistor T3, the initialization thin film transistor T4, the operation control thin film transistor T5, the emission control thin film transistor T6, and the bypass thin film transistor T7 are formed along the semiconductor layer illustrated in FIG. 6. The semiconductor layer may have a shape curved in various forms. The semiconductor layer may include a driving channel region 131a corresponding to the driving thin film transistor T1, a switching channel region 131b corresponding to the switching thin film transistor T2, compensation channel regions 131c1, 131c2, and 131c3 corresponding to the compensation thin film transistor T3, initialization channel regions 131d1, 131d2, and 131d3 corresponding to the initialization thin film transistor T4, an operation control channel region 131e corresponding to the operation control thin film transistor T5, an emission control channel region 131f corresponding to the emission control thin film transistor T6, and a bypass channel region 131g corresponding to the bypass thin film transistor T7. That is, the driving channel region 131a, the switching channel region 131b, the compensation channel regions 131c1, 131c2, and 131c3, the initialization channel regions 131d1, 131d2, and 131d3, the operation control channel region 131e, the emission control channel region 131f, and the bypass channel region 131g may be understood as partial regions of the semiconductor layer illustrated in FIG. 6.

The semiconductor layer may include polycrystalline silicon. Also, the semiconductor layer may include, for example, the channel regions which are not doped with impurities, and source regions and drain regions which are disposed in two opposite sides of the channel region and doped with impurities. Here, the impurities differ depending on a kind of a thin film transistor and may include N-type impurities or P-type impurities. For the semiconductor layer including silicon (Si), the P-type impurities may include, for example, boron (B), aluminum (Al), gallium (Ga) and indium (In), and the N-type impurities may include, for example, antimony (Sb), arsenic (As) and phosphorous (P). The channel region, the source region located in one side of the channel region, and the drain region located in an opposite side of the channel region may be referred to as an active layer. That is, it may be understood that the thin film transistor includes the active layer, and the active layer includes the channel region, the source region, and the drain region.

The doped source region or drain region may be construed as a source electrode or drain electrode of a thin film transistor depending on a case. That is, a driving source electrode may correspond to a driving source region 176a doped with impurities in the vicinity of the driving channel region 131a of the semiconductor layer illustrated in FIG. 6, and a driving drain electrode may correspond to a driving drain region 177a doped with impurities in the vicinity of the driving channel region 131a of the semiconductor layer illustrated in FIG. 6. Also, as described above, the intermediate connection layer 175 may serve as the drain electrode of the emission control thin film transistor T6. Various modifications may be made. Also, corresponding portions of the semiconductor layer between thin film transistors in the semiconductor layer illustrated in FIG. 6 may be doped with impurities and construed as wirings configured to electrically connect the thin film transistors. The same is applied to example embodiments and modifications below. Alternatively, the source and drain electrodes may include a metal such as, for example, aluminum (Al) or molybdenum (Mo).

The capacitor Cst may include the capacitor lower electrode 125a and the capacitor upper electrode 127 arranged with the second gate insulating layer 142 therebetween. In this case, the capacitor lower electrode 125a may simultaneously serve as a driving gate electrode 125a of the driving thin film transistor T1. That is, the driving gate electrode 125a and the capacitor lower electrode 125a may be understood as sharing one body. Hereinafter, when referring to the driving gate electrode, the same reference numeral as that of the capacitor lower electrode 125a is used, for convenience of description.

Figure 7:
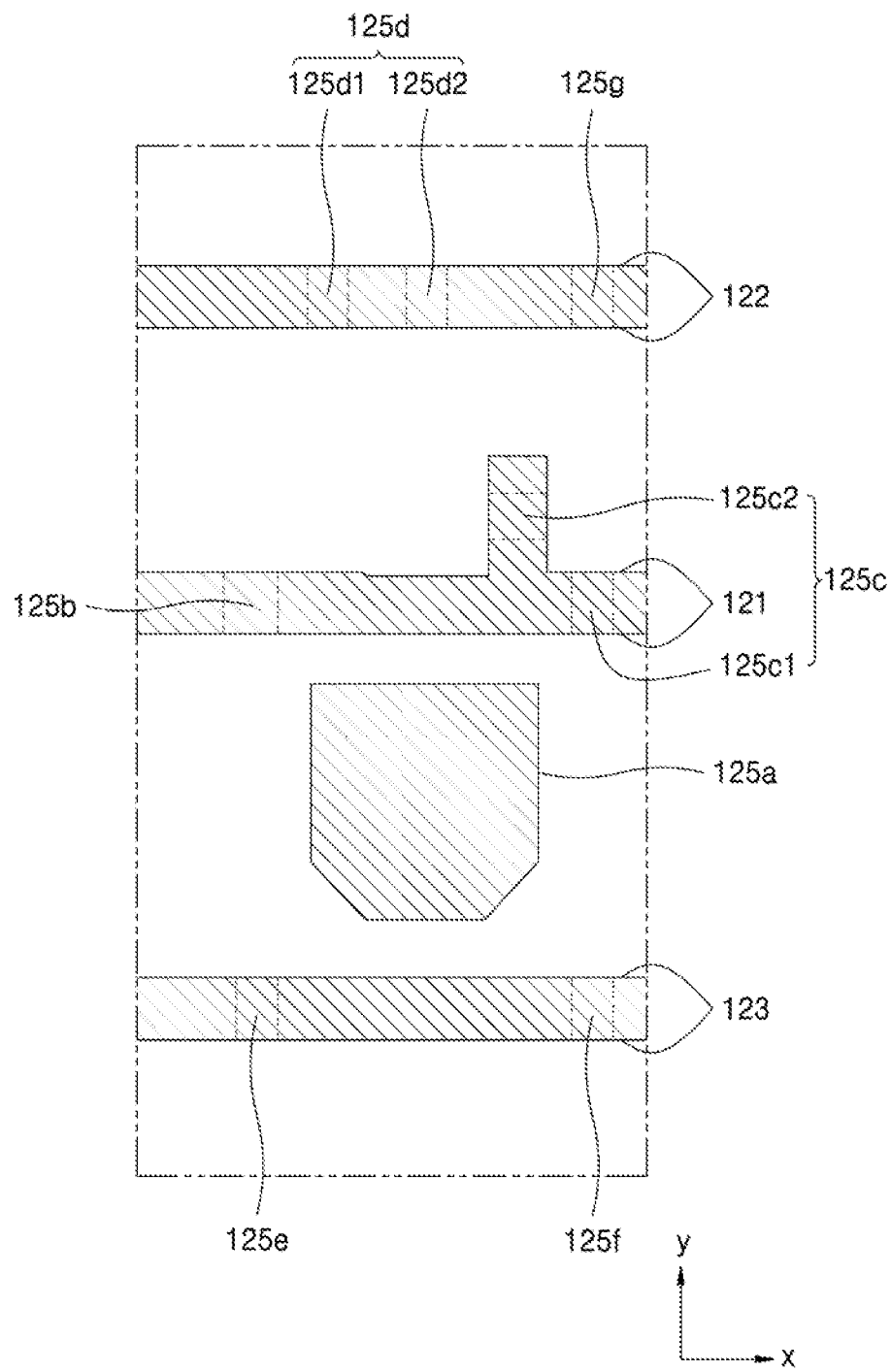

As illustrated in FIG. 7, the capacitor lower electrode 125a may have an island shape separated from an adjacent (sub)pixel. The capacitor lower electrode 125a may be arranged in a layer in which the scan line 121, the previous scan line 122, and the emission control line 123 are arranged by using a material the same as that of the scan line 121, the previous scan line 122, and the emission control line 123.

For reference, it may be understood that a switching gate electrode 125b and compensation gate electrodes 125c1 and 125c2 are portions of the scan line 121 extending in the x-axis direction crossing the semiconductor layer, or portions protruding from the scan line 121, initialization gate electrodes 125d1 and 125d2 and a bypass gate electrode 125g are portions of the previous scan line 122 extending in the x-axis direction crossing the semiconductor layer, or portions protruding from the previous scan line 122, and an operation control gate electrode 125e and an emission control gate electrode 125f are portions of the emission control line 123 extending in the x-axis direction crossing the semiconductor layer, or portions protruding from the emission control line 123.

Figure 8:
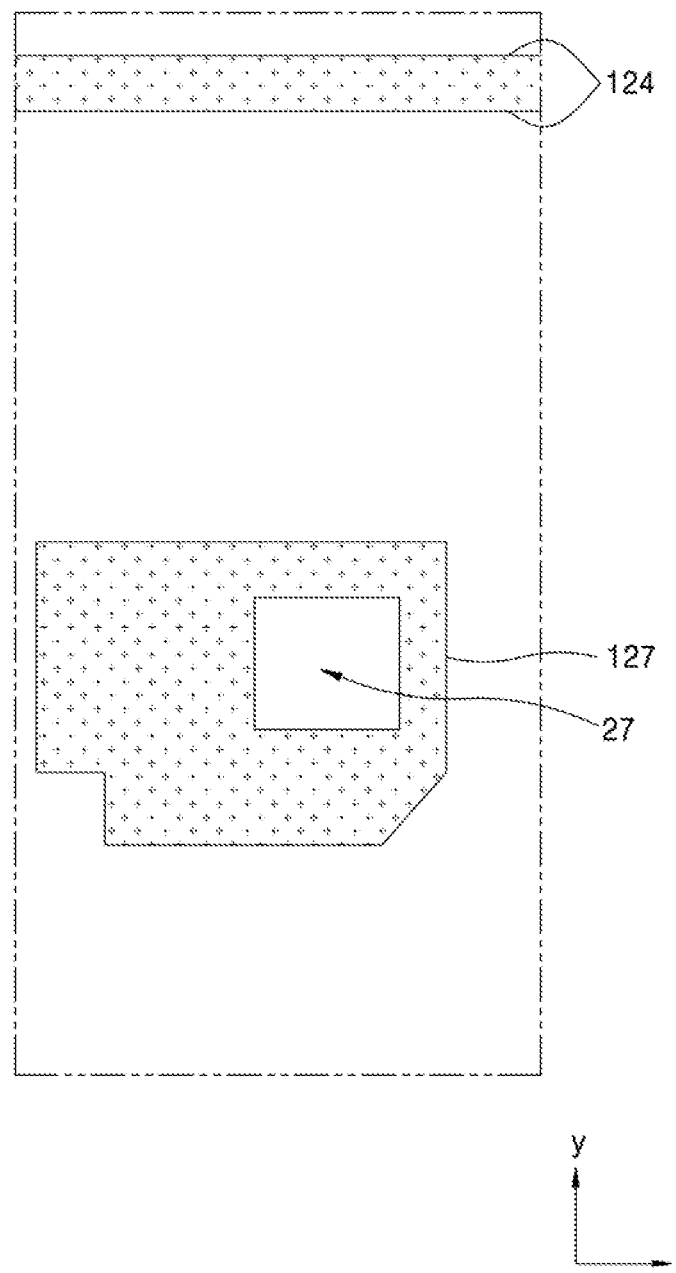

The capacitor upper electrode 127 may be connected over adjacent (sub)pixels, and as illustrated in FIG. 8, may be arranged in a layer in which the initialization voltage line 124 is arranged by using a material the same as that of the initialization voltage line 124. An opening 27 may be formed in the capacitor upper electrode 127. The capacitor lower electrode 125a may be electrically connected to a compensation drain region 177c of the compensation thin film transistor T3 by using a connection member 174 described below through the opening 27. An area of the capacitor upper electrode 127 may be larger than an area of the capacitor lower electrode 125a, and the capacitor upper electrode 127 may cover the whole capacitor lower electrode 125a. The capacitor upper electrode 127 may be connected to the lower power supply line 172 through a contact hole 168 in the interlayer insulating layer 143 (see FIGS. 5 and 11).

The driving thin film transistor T1 includes the driving channel region 131a, the driving gate electrode 125a, the driving source region 176a, and the driving drain region 177a. As described above, the driving gate electrode 125a may serve as the capacitor lower electrode 125a. The driving source region 176a is a portion (in a −x direction in FIG. 6) outside the driving gate electrode 125a, and the driving drain region 177a is a portion (in a +x direction in FIG. 6) outside the driving gate electrode 125a and is located on an opposite side of the driving source region 176a around the driving gate electrode 125a. The driving source region 176a of the driving thin film transistor T1 is connected to a switching drain region 177b and an operation control drain region 177e described below. The driving drain region 177a is connected to a compensation source region 176c and an emission control source region 176f described below. As shown in FIG. 4, the gate electrode G1 of the driving thin film transistor T1 (e.g., the driving gate electrode 125a) is connected to the capacitor lower electrode Cst1 of the capacitor Cst (e.g., the capacitor lower electrode 125a), the drain electrode D3 of the compensation thin film transistor T3 (e.g., the compensation drain region 177c, through the connection member 174), and a drain electrode D4 of the initialization thin film transistor T4 (e.g., an initialization drain region 177d to be described) (see FIG. 5).

The switching thin film transistor T2 includes the switching channel region 131b, the switching gate electrode 125b, a switching source region 176b, and a switching drain region 177b. The switching source region 176b may be electrically connected to the data line 171 through a contact hole 164 in the first gate insulating layer 141, the second gate insulating layer 142, and the interlayer insulating layer 143. In this case, as required, a portion of the data line 171 in the vicinity of the contact hole 164 may be understood as a source region of the switching thin film transistor T2. The switching drain region 177b is located on an opposite side of the switching source region 176b around the switching channel region 131b, and may be a portion of the semiconductor layer doped with impurities.

The switching thin film transistor T2 is used as a switching device configured to select a (sub)pixel which will emit light. The switching gate electrode 125b is connected to the scan line 121, the switching source region 176b is connected to the data line 171 as described above, and the switching drain region 177b is connected to the driving thin film transistor T1 and the operation control thin film transistor T5. As shown in FIG. 4, the drain electrode D2 of the switching thin film transistor T2 (e.g., the switching drain region 177b) is connected to the source electrode S1 of the driving thin film transistor T1 (e.g., the driving source region 176a) and the drain electrode D5 of the operation control thin film transistor T5 (e.g., the operation control drain region 177e).

The compensation thin film transistor T3 includes the compensation channel regions 131c1, 131c2, and 131c3, the compensation gate electrodes 125c1 and 125c2, the compensation source region 176c, and a compensation drain region 177c. The compensation source region 176c is a portion of the semiconductor layer doped with impurities in the vicinity of the compensation channel regions 131c1, 131c2, and 131c3, the compensation drain region 177c is a portion of the semiconductor layer doped with impurities in the vicinity of the compensation channel regions 131c1, 131c2, and 131c3. The compensation gate electrodes 125c1 and 125c2 are a dual gate electrode including the first gate electrode 125c1 and the second gate electrode 125c2 and may prevent or reduce the occurrence of a leakage current. The compensation drain region 177c of the compensation thin film transistor T3 may be connected to the capacitor lower electrode 125a through the connection member 174. The compensation channel regions 131c1, 131c2, and 131c3 may include the portion 131c1 corresponding to the first gate electrode 125c1, the portion 131c3 corresponding to the second gate electrode 125c2, and the portion 131c2 between the two portions 131c1 and 131c3.

Figure 9:
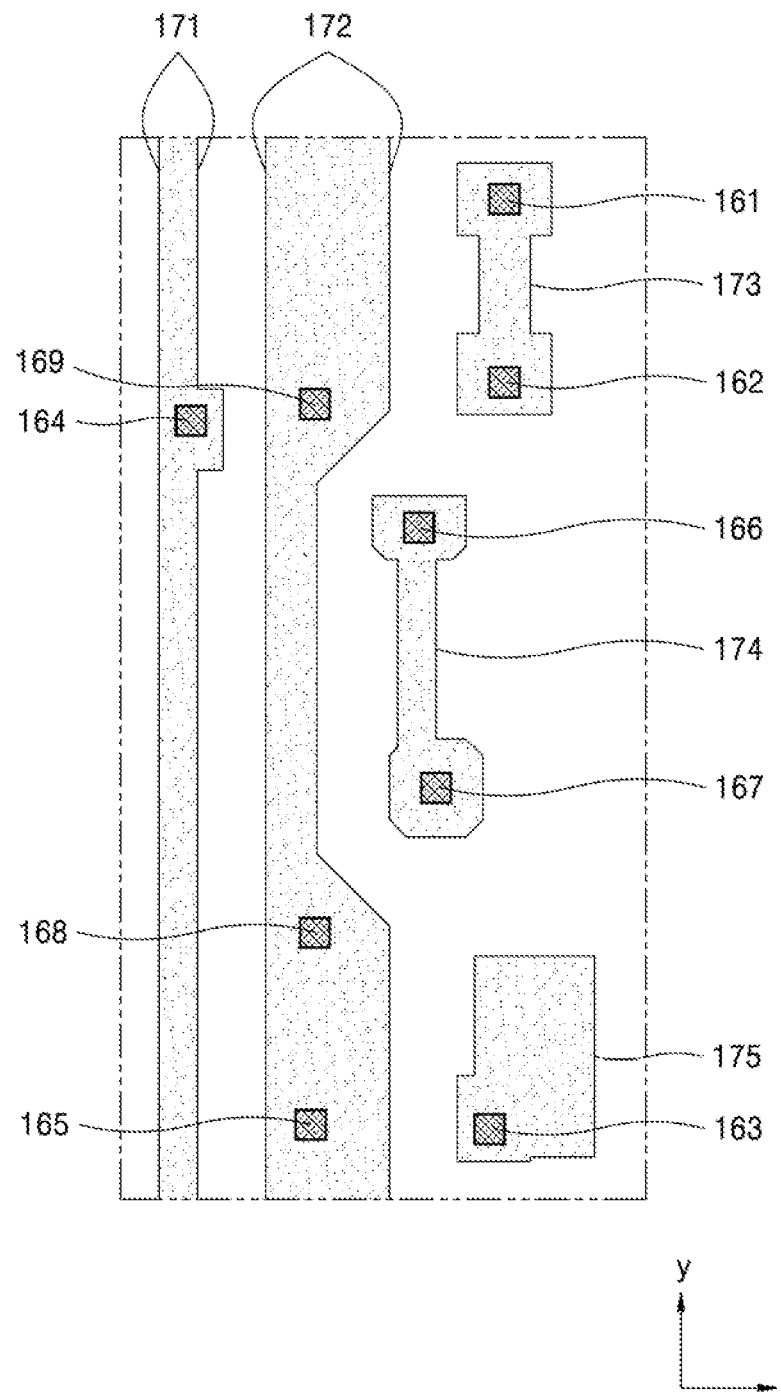

As illustrated in FIG. 9, the connection member 174 may be formed in a layer in which the data line 171 and the intermediate connection layer 175 are arranged by using a material the same as that of the data line 171 and the intermediate connection layer 175. One end of the connection member 174 is connected to the compensation drain region 177c and an initialization drain region 177d through a contact hole 166 in the first gate insulating layer 141, the second gate insulating layer 142, and the interlayer insulating layer 143, and the other end of the connection member 174 is connected to the capacitor lower electrode 125a through a contact hole 167 in the second gate insulating layer 142 and the interlayer insulating layer 143. In this case, the other end of the connection member 174 is connected to the capacitor lower electrode 125a through an opening 27 in the capacitor upper electrode 127. For example, the contact hole 167 is positioned within the opening 27 as viewed from a direction perpendicular to the substrate 110.

The initialization thin film transistor T4 includes the initialization channel region 131d which may include the initialization channel regions 131d1, 131d2, and 131d3, the initialization gate electrode 125d, an initialization source region 176d, and the initialization drain region 177d. The initialization gate electrode 125d may be a dual gate electrode including the gate electrodes 125d1 and 125d2. The initialization source region 176d is connected to the initialization voltage line 124 through an initialization connection line 173. One end of the initialization connection line 173 may be connected to the initialization voltage line 124 through a contact hole 161 in the interlayer insulating layer 143, and another end of the initialization connection line 173 may be connected to the initialization source region 176d through a contact hole 162 in the first gate insulating layer 141, the second gate insulating layer 142, and the interlayer insulating layer 143. The initialization drain region 177d is a portion of the semiconductor layer doped with impurity, and may be located on an opposite side of the initialization source region 176d around the initialization channel region 131d.

The operation control thin film transistor T5 includes the operation control channel region 131e, the operation control gate electrode 125e, an operation control source region 176e, and the operation control drain region 177e. The operation control source region 176e may be electrically connected to the lower power supply line 172 through a contact hole 165 in the first gate insulating layer 141, the second gate insulating layer 142, and the interlayer insulating layer 143. In this case, as required, a portion of the lower power supply line 172 in the vicinity of the contact hole 165 may be understood as a source region of the operation control thin film transistor T5. The operation control drain region 177e is a portion of the semiconductor layer doped with impurities, and may be located on an opposite side of the operation control source region 176e around the operation control channel region 131e.

The emission control thin film transistor T6 includes the emission control channel region 131f, the emission control gate electrode 125f, the emission control source region 176f, and the emission control drain region 177f. The emission control drain region 177f may be connected to the intermediate connection layer 175 on the interlayer insulating layer 143 through a contact hole 163 in the first gate insulating layer 141, the second gate insulating layer 142, and the interlayer insulating layer 143. As illustrated in FIG. 9, the intermediate connection layer 175 may be located on the interlayer insulating layer 143 together with the data line 171, the lower power supply line 172, etc. The emission control source region 176f is a portion of the semiconductor layer doped with impurities, and may be located on an opposite side of the emission control drain region 177f around the emission control channel region 131f. As described below, the intermediate connection layer 175 is electrically connected to an auxiliary connection layer 179 and consequently electrically connected to the pixel electrode 191 of the organic light-emitting diode OLED (see FIG. 11). As shown in FIG. 4, the drain electrode D6 of the emission control thin film transistor T6 (e.g., the emission control drain region 177l) is electrically connected to a source electrode S7 of the bypass thin film transistor T7 (e.g., a bypass source region 176g to be described) and the pixel electrode 191 of the organic light-emitting diode OLED.

The bypass thin film transistor T7 includes the bypass channel region 131g, the bypass gate electrode 125g, a bypass source region 176g, and a bypass drain region 177g. The bypass drain region 177g is connected to the initialization source region 176d of the initialization thin film transistor T4, and thus connected to the initialization voltage line 124 through the initialization connection line 173. The bypass source region 176g is electrically connected to a pixel electrode of an organic light-emitting diode OLED of a (sub)pixel (in the +y direction). Specifically, the bypass source region 176g may be connected to the emission control drain region 177f of the (sub)pixel (in the +y direction), and thus connected to the intermediate connection layer 175 on the interlayer insulating layer 143 through the contact hole 163. As described above, the intermediate connection layer 175 is electrically connected to the auxiliary connection layer 179 and consequently electrically connected to the pixel electrode 191 of the organic light-emitting diode OLED. When the bypass thin film transistor T7 is turned off and a portion of the driving current $I_d$ flows through the bypass thin film transistor T7 as a bypass current $I_{bp}$, a black image is produced by transferring a current less than the minimum driving current to the organic light-emitting diode OLED.

As illustrated in FIG. 9, the data line 171, the lower power supply line 172, the initialization connection line 173, the connection member 174, and the intermediate connection layer 175 may include the same material, and may be located on the same layer, for example, the interlayer insulating layer 143. The lower power supply line 172 supplies a constant electric signal over a plurality of (sub)pixels. Therefore, to implement a display device displaying a high-quality image, it is required that a voltage drop does not occur in the lower power supply line 172. When a voltage drop occurs in the lower power supply line 172, even though data signals are applied to a plurality of (sub)pixels such that the plurality of (sub)pixels emit light having the same brightness, the brightness of emitted light varies depending on locations of the plurality of (sub)pixels, and thus an image quality may be deteriorated.

Since the lower power supply line 172 is located on the same layer together with the data line 171, the initialization connection line 173, the connection member 174, the intermediate connection layer 175, etc. as illustrated in FIG. 9, there is a limit in increasing an area of the lower power supply line 172. As a result, it may not be easy to minimize a voltage drop in the lower power supply line 172.

Figure 10:
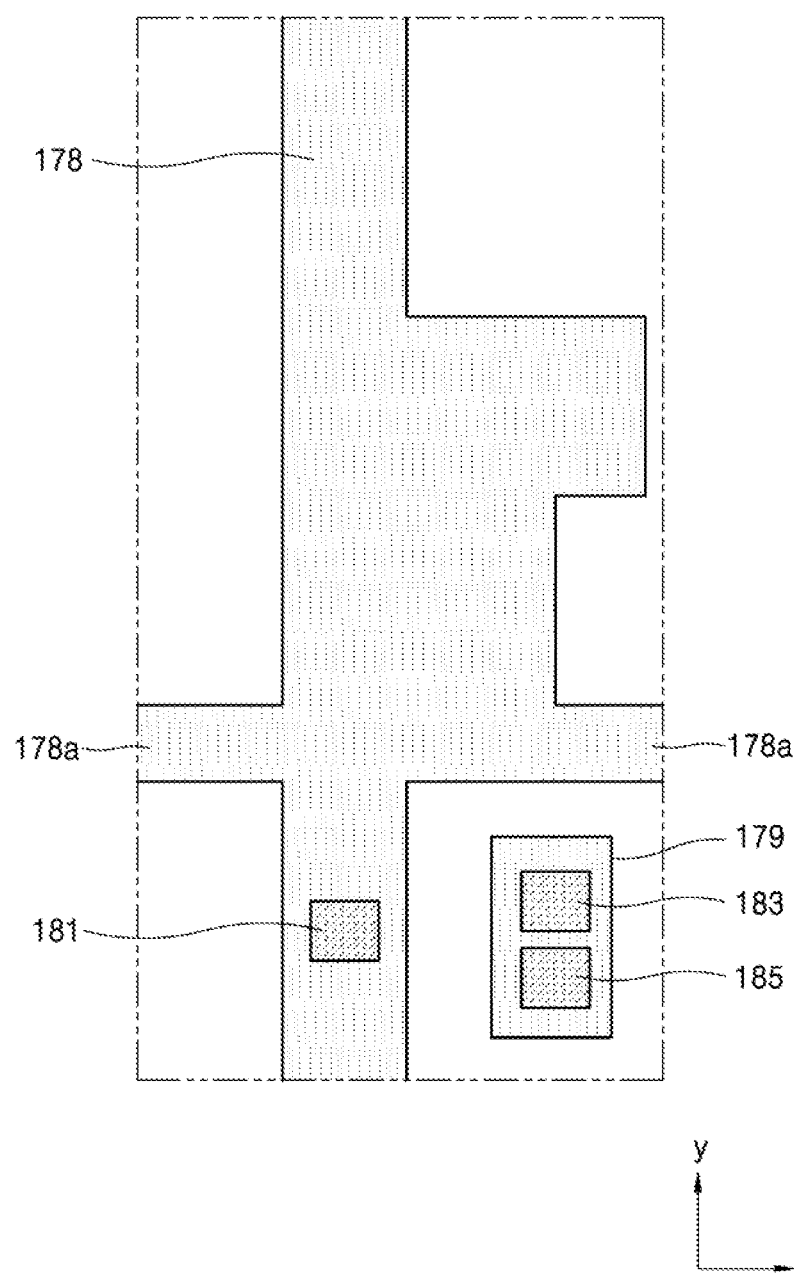

The display device according to the present example embodiment may resolve the problem of the voltage drop in the lower power supply line 172 by arranging the upper power supply line 178 illustrated in FIG. 10 over the lower power supply line 172, the initialization connection line 173, the connection member 174, and the intermediate connection layer 175, and electrically connecting the upper power supply line 178 to the lower power supply line 172 through a contact hole 181. For example, the display device may allow the upper power supply lines 178 extending in the y direction to be electrically connected to each other by having branch lines 178a extending in the x direction between the upper power supply lines 178 extending in the y direction as illustrated in FIG. 10. In this case, since the upper power supply line 178 has, consequently, an approximately "+" shape for one (sub)pixel as illustrated in FIG. 10, it may be understood that the upper power supply line 178 has an approximately lattice shape over the entire display area DA. Through this configuration, a uniform electric signal may be applied to the circuit units through the lower power supply line 172 and/or the upper power supply line 178 over the entire display area DA.

Since FIGS. 5 to 10 illustrate only one (sub)pixel, the display device according to the present example embodiment may include the plurality of lower power supply lines 172 and the plurality of upper power supply lines 178 as described above. In this case, it may be understood that the plurality of upper power supply lines 178 one-to-one correspond to the plurality of lower power supply lines 172, and the plurality of upper power supply lines 178 are electrically connected to the plurality of corresponding lower power supply lines 172.

Each of the lower power supply lines 172 may be electrically connected to a corresponding upper power supply line 178 at a plurality of locations. That is, since FIG. 10 illustrates only one (sub)pixel, it is illustrated that the lower power supply line 172 is electrically connected to a corresponding upper power supply line 178 through one contact hole 181, but the present disclosure is not limited thereto. For example, the lower power supply line 172 and the upper power supply line 178 shared by a plurality of (sub)pixels arranged along y axis may be electrically connected to each other at a plurality of locations.

As illustrated in FIG. 10, if the lower power supply line 172 and the upper power supply line 178 are mutually electrically connected for each (sub)pixel, consequently, the plurality of lower power supply lines 172 and the plurality of upper power supply lines 178 may be mutually electrically connected at points corresponding to the plurality of pixel electrodes 191. That is, the number of contact holes 181 through which the plurality of lower power supply lines 172 and the plurality of upper power supply lines 178 are mutually electrically connected may correspond to the number of pixel electrodes 191.

In some of the (sub)pixels arranged along y axis, the lower power supply line 172 may be directly connected to the upper power supply line 178 as illustrated in FIG. 10, and in others, the lower power supply line 172 may not be directly connected to the upper power supply line 178. That is, in the entire display area DA, the plurality of lower power supply lines 172 and the plurality of upper power supply lines 178 may be mutually electrically connected, and may be electrically connected at points corresponding to some of the plurality of pixel electrodes 191. Furthermore, the plurality of lower power supply lines 172 and the plurality of upper power supply lines 178 may be mutually electrically connected at points located in random inside the display area DA.

As described above, the emission control drain region 177f should be electrically connected to the pixel electrode 191 of the organic light-emitting diode OLED. Therefore, the auxiliary connection layer 179 including a material the same as that of the upper power supply line 178 may be located in a layer the same as that of the upper power supply line 178, and may be electrically connected to the intermediate connection layer 175 through a contact hole 183, in which the intermediate connection layer 175 may be electrically connected to the emission control drain region 177f through the contact hole 163. Since the auxiliary connection layer 179 is electrically connected to the pixel electrode 191 of the organic light-emitting diode OLED through a contact hole 185 in a layer arranged on the auxiliary connection layer 179, the emission control drain region 177f may be electrically connected to the pixel electrode 191 of the organic light-emitting diode OLED. In addition, the emission control drain region 177f may be electrically connected to the bypass source region 176g and the pixel electrode 191 of the organic light-emitting diode OLED. When the bypass thin film transistor T7 is turned off, the bypass thin film transistor T7 may distribute a portion of the driving current $I_d$ flowing from the driving thin film transistor T1 to another current path as the bypass current $I_{bp}$ besides a current path toward the organic light-emitting diode OLED to prevent the organic light-emitting diode OLED from emitting light.

Figure 11:
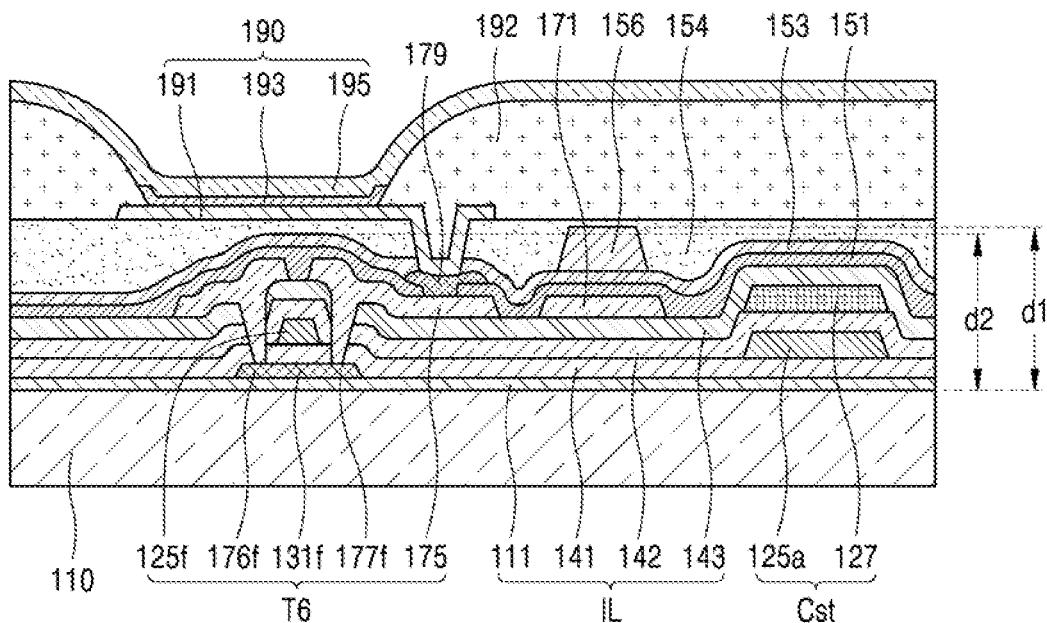
FIG. 11 is a cross-sectional view of a portion of the display device of FIGS. 5 to 10.

FIG. 11 is a cross-sectional view of a portion of a display device of FIGS. 5 to 10. For reference, FIG. 11 illustrates cross-sectional views of, for convenience, a plurality of portions of the display device of FIGS. 5 to 10 are connected, and respective portions of FIG. 11 do not need to be adjacent to each other. For example, a portion in which the emission control thin film transistor T6 and the organic light-emitting diode 190 are illustrated, a portion in which the data line 171 and the first crack induction layer 156 are illustrated, and a portion in which the capacitor Cst is illustrated may not be adjacent to each other as illustrated in FIG. 11. Also, relative locations of these elements are not limited to a sequence illustrated in FIG. 11. That is, the portion in which the data line 171 and the first crack induction layer 156 are illustrated does not need to be located between the portion in which the emission control thin film transistor T6 and the organic light-emitting diode 190 are illustrated and the portion in which the capacitor Cst is illustrated.

As illustrated in FIG. 11, the various elements described up to now may be located over the substrate 110. Also, the elements have structures similar to those described with reference to FIG. 1 such as, for example, the channel regions, source regions, drain regions, etc. illustrated in FIG. 6 are arranged on the buffer layer 111, and the first gate insulating layer 141 may cover these elements. Also, the conductive layers illustrated in FIG. 7 may be arranged on the first gate insulating layer 141. The conductive layers illustrated in FIG. 7 may be referred to as first gate wirings. The second gate insulating layer 142 may cover the first gate wirings, and the conductive layers illustrated in FIG. 8 may be arranged on the second gate insulating layer 142. The conductive layers illustrated in FIG. 8 may be referred to as second gate wirings.

The interlayer insulating layer 143 may cover the second gate wirings. The data line 171, the lower power supply line 172, the initialization connection line 173, the connection member 174, and the intermediate connection layer 175 illustrated in FIG. 9 may be arranged on the interlayer insulating layer 143. The data line 171, the initialization connection line 173, the connection member 174, and the intermediate connection layer 175 may be collectively referred to as the first conductive layers, and the lower power supply line 172 may be understood as being arranged in the same layer in which the first conductive layers are arranged. Since the lower power supply line 172 is arranged in the same layer in which the first conductive layers are arranged, they may be simultaneously formed during a manufacturing process. As a result, the lower power supply line 172 may include a material the same as that of the first conductive layers, and furthermore, the lower power supply line 172 may have a layered structure the same as that of the first conductive layers.

The data line 171, the lower power supply line 172, the initialization connection line 173, the connection member 174, and the intermediate connection layer 175 may be electrically connected to the semiconductor layer, the initialization voltage line 124, the capacitor lower electrode 125a, the capacitor upper electrode 127, etc. through contact holes 161, 162, 163, 164, 165, 166, 167, 168, and 169 in at least some of the first gate insulating layer 141, the second gate insulating layer 142, and the interlayer insulating layer 143.

The first inorganic layer 151 is arranged over the first conductive layer and the lower power supply line 172. The first inorganic layer 151 may include, for example, silicon oxide ($SiO_2$), silicon nitride ($Si_3N_4$), or silicon oxynitride (SiON). The upper power supply line 178 and the auxiliary connection layer 179 illustrated in FIG. 10 may be arranged on the first inorganic layer 151. The auxiliary connection layer 179 may be referred to as the second conductive layer, and the upper power supply line 178 may be understood as being arranged in the same layer in which the second conductive layer is arranged. Since the upper power supply line 178 is arranged in the same layer in which the second conductive layer is arranged, they may be simultaneously formed during the manufacturing process. As a result, the upper power supply line 178 may include a material the same as that of the second conductive layer, and furthermore, the upper power supply line 178 may have a layered structure the same as that of the second conductive layers.

The upper power supply line 178 and the auxiliary connection layer 179 may be electrically connected to the lower power supply line 172 and the first conductive layer therebelow through contact holes 181 and 183, respectively, in the first inorganic layer 151. Specifically, the first inorganic layer 151 includes an opening for the contact hole 181 to expose at least a portion of a first top surface of the lower power supply line 172 therebelow, and the upper power supply line 178 may contact the lower power supply line 172 through the opening. The first inorganic layer 151 may include an opening for the contact hole 183 to allow the auxiliary connection layer 179 thereunder to contact the intermediate connection layer 175.

A second inorganic layer 153 is arranged on the second conductive layer and the upper power supply line 178, and may include, for example, silicon oxide ($SiO_2$), silicon nitride ($Si_3N_4$), or silicon oxynitride (SiON). The second inorganic layer 153 covers the second conductive layer and the upper power supply line 178 to contact the first inorganic layer 151 outside the second conductive layer. The first inorganic layer 151 and the second inorganic layer 153 may be collectively referred to as additional inorganic insulating layers covering the interlayer insulating layer 143 and the first and second gate insulating layers 141 and 142 which are inorganic insulating layers.

The first organic insulating layer 154, which is a planarization layer, may be arranged on the second inorganic layer 153, and the pixel electrode 191 of the organic light-emitting diode 190 may be located on the first organic insulating layer 154. The pixel electrode 191 may be connected to the auxiliary connection layer 179 through an opening in the second inorganic layer 153 and a contact hole 185 in the first organic insulating layer 154, and consequently, electrically connected to the emission control drain region 177f. Also, the first crack induction layer 156 located inside the first organic insulating layer 154 is located on the second inorganic layer 153 which is the additional inorganic insulating layer.

In the case where a pixel circuit including a large number of thin film transistors and capacitors is located in one (sub)pixel, the first crack induction layer 156 described above may be located at a place where the conductive layers do not mutually overlap as viewed from a direction perpendicular to the substrate 110. FIGS. 5 and 11 illustrate that the first crack induction layer 156 is located over the data line 171, and a location of the first crack induction layer 156 is selected such that only an insulating material is arranged between the substrate 110 and a portion of the data line 171 corresponding to the first crack induction layer 156. For example, the first crack induction layer 156 may not overlap the thin film transistor T6, the capacitor Cst, or other wirings than the data line 171. In addition, the first crack induction layer 156 may be properly configured so as to allow an external impact to reach the first crack induction layer 156 first before reaching the thin film transistor T6, the capacitor Cst, or other wirings than the data line 171. Through this configuration, in the case where the external impact is applied, the impact may be concentrated on the first crack induction layer 156, and also, even when a crack occurs in the first crack induction layer 156, the first inorganic layer 151, or the second inorganic layer 153 thereunder, or a crack occurs in the data line 171 therebelow, the first gate insulating layer 141, the second gate insulating layer 142 and/or the interlayer insulating layer 143 therebelow, the data line 171 may not be short-circuited to other wirings. In this case, the first crack induction layer 156 has an island shape as viewed from a direction perpendicular to the substrate 110.

Since elements located in a layer the same as that of the data line 171 and the intermediate connection layer 175 may include the same material as illustrated in FIG. 9, and elements located in a layer the same as that of the capacitor lower electrode 125a may include the same material as illustrated in FIG. 7, strength of the conductive layers illustrated in FIG. 9 may be less than strength of the conductive layers illustrated in FIG. 7. For example, the conductive layers illustrated in FIG. 9 may include aluminum (Al) and the conductive layers illustrated in FIG. 7 may include molybdenum (Mo).

Since the first crack induction layer 156 is located over the data line 171 as illustrated in FIG. 11, a crack occurring in the first crack induction layer 156 or a portion thereunder may extend to the data line 171. In this case, growth of the crack may stop and may not extend therebelow by allowing the data line 171 to include a material of low strength.

A distance d1 from the substrate 110 to a top surface of the first crack induction layer 156 may be greater than a maximum distance among distances from the substrate 110 to top surfaces of elements included in the thin film transistor T6. Furthermore, as illustrated in FIG. 11, the distance d1 from the substrate 110 to the top surface of the first crack induction layer 156 may be greater than a maximum distance d2 among distances from the substrate 110 to top surfaces of the inorganic material layers below the first organic insulating layer 154. FIG. 11 illustrates that a top surface farthest from the substrate 110 among the top surfaces of the inorganic material layers below the first organic insulating layer 154 is a top surface of the second inorganic layer 153. Through this configuration, when an impact is applied in a direction to the substrate 110 from above, most of the impact may be transferred to the first crack induction layer 156 by allowing the impact reaches the first crack induction layer 156 first before the impact reaches the inorganic material layer under the first organic insulating layer 154. Accordingly, the occurrence of a crack in the thin film transistor T6 or the capacitor Cst may be effectively prevented so as not to damage the pixel circuit. As a result, the display device according to the present example embodiment may be solid against an external impact.

In FIG. 11, the first crack induction layer 156 is formed over the data line 171 with the first inorganic layer 151 and the second inorganic layer 153 interposed therebetween. However, the present disclosure is not limited thereto. For example, in an example embodiment of the present disclosure, the first crack induction layer 156 is formed over the first inorganic layer 151 and/or the second inorganic layer 153, but the first crack induction layer 151 does not overlap the data line 171 as viewed from a direction perpendicular to the substrate 110.

Figure 12:
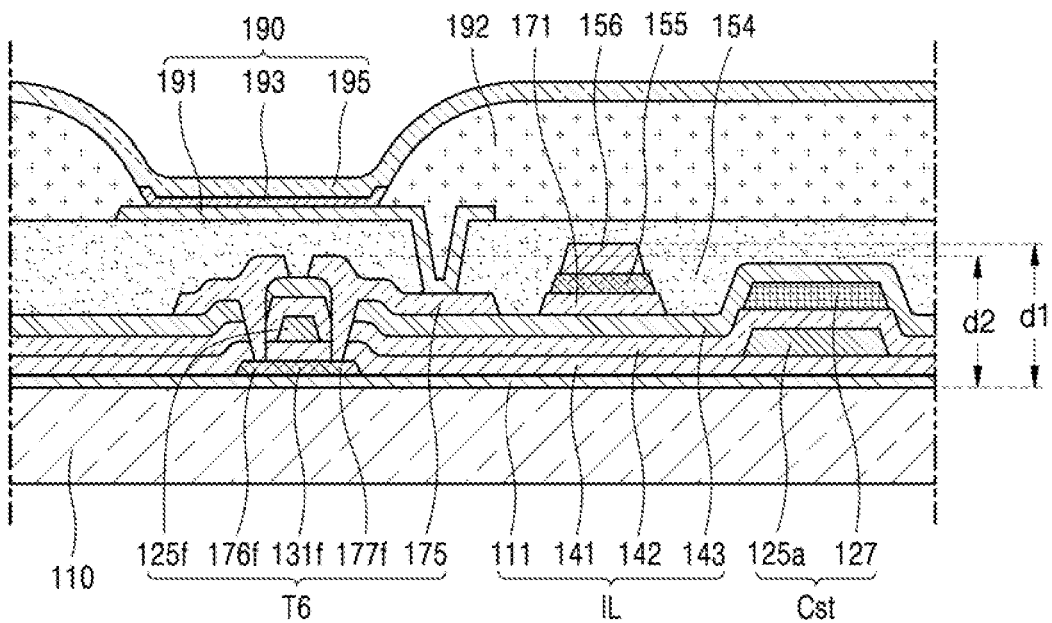
FIG. 12 is a cross-sectional view of a portion of a display device according to an example embodiment of the present disclosure.

FIG. 12 is a cross-sectional view of a portion of a display device according to an example embodiment of the present disclosure. Though FIG. 12 does not illustrate the first inorganic layer 151 and the second inorganic layer 153, the display device according to the present example embodiment may include the first inorganic layer 151 and the second inorganic layer 153. The display device according to the present example embodiment further includes an organic material layer 155 arranged between the first crack induction layer 156 and the data line 171. Through this configuration, even when a crack occurs in the first crack induction layer 156, the crack may be blocked by the organic material layer 155 and thus may not extend to the data line 171. Accordingly, the occurrence of a crack in the thin film transistor T6 or the capacitor Cst may be effectively prevented so as not to damage the pixel circuit. As a result, the display device according to the present example embodiment may be solid against an external impact.

Figure 13:
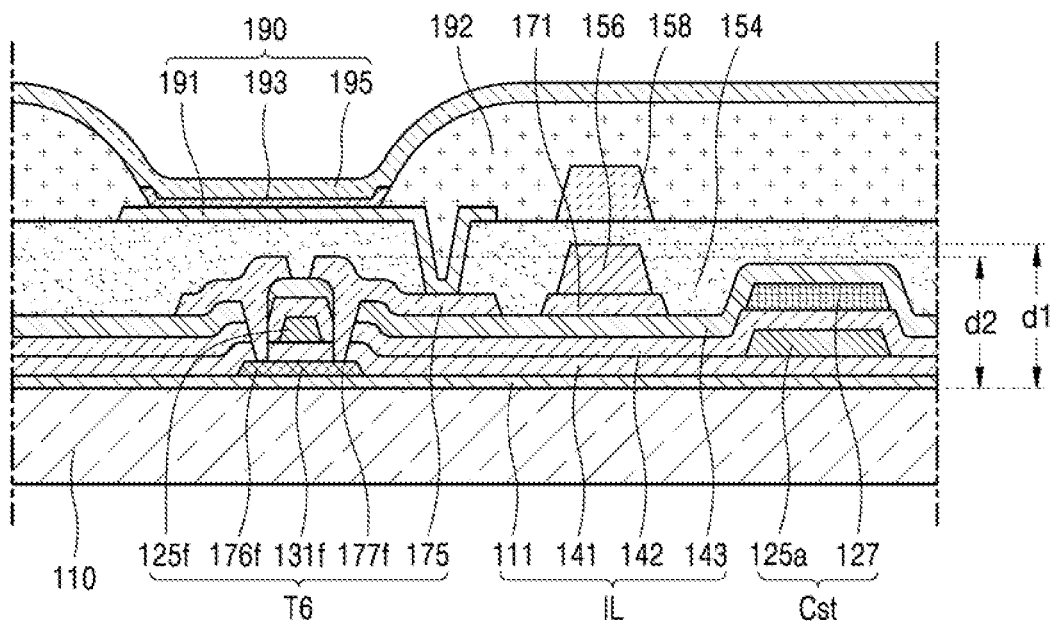
FIG. 13 is a cross-sectional view of a portion of a display device according to an example embodiment of the present disclosure.

FIG. 13 is a cross-sectional view of a portion of a display device according to an example embodiment of the present disclosure. As illustrated in FIG. 13, a second crack induction layer 158 located inside the second organic insulating layer 192 may be further provided. The second crack induction layer 158 may have a single/multi-layered structure including an inorganic insulating material such as, for example, silicon oxide ($SiO_2$), silicon nitride ($Si_3N_4$), or silicon oxynitride (SiNO). Since the second crack induction layer 158 is located in an upper portion farther away from the substrate 110 than the first crack induction layer 156, the second crack induction layer 158 may remarkably reduce a crack occurrence probability in the inorganic layers located therebelow and reduce a size of a crack even when the crack occurs in the inorganic layers located therebelow by absorbing an external impact first.

The second crack induction layer 158 may have an island shape arranged such that at least a portion of the second crack induction layer 158 overlaps the first crack induction layer 156 as viewed from a direction perpendicular to the substrate 110. Therefore, the second crack induction layer 158 may not overlap the thin film transistor T6 as viewed from the direction perpendicular to the substrate 110. Accordingly, the occurrence of a crack in the thin film transistor T6 or the capacitor Cst may be effectively prevented so as not to damage the pixel circuit. As a result, the display device according to the present example embodiment may be solid against an external impact.

Figure 14:
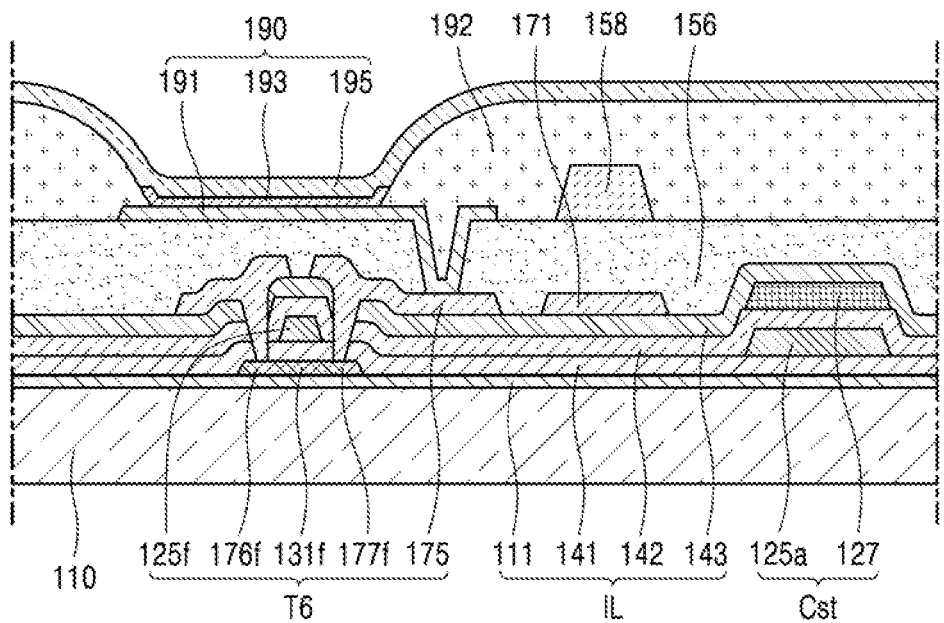
FIG. 14 is a cross-sectional view of a portion of a display device according to an example embodiment of the present disclosure.

As illustrated in FIG. 14, which is a cross-sectional view of a portion of a display device according to an example embodiment of the present disclosure, the display device may include only the second crack induction layer 158 inside the second organic insulating layer 192 without the first crack induction layer 156, and various modifications may be made. In this case, the second crack induction layer 158 may not overlap the thin film transistor T6 or the capacitor Cst and may have an island shape as viewed from the direction perpendicular to the substrate 110. With this configuration, the second crack induction layer 158 may remarkably reduce a crack occurrence probability in the inorganic layers located therebelow and reduce a size of a crack even when the crack occurs in the inorganic layers located therebelow by absorbing an external impact first. Accordingly, the occurrence of a crack in the thin film transistor T6 or the capacitor Cst may be effectively prevented so as not to damage the pixel circuit. As a result, the display device according to the present example embodiment may be solid against an external impact.

While the present disclosure has been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A display device comprising:
   a substrate having a display area;
   a thin film transistor arranged over the substrate in the display area;
   a first organic insulating layer arranged over the thin film transistor;
   a pixel electrode located over the first organic insulating layer and electrically connected to the thin film transistor;
   an intermediate layer located on the pixel electrode; and
   a first crack induction layer located inside the first organic insulating layer and in the display area, a width of an upper surface of the first crack induction layer being smaller than a width of a bottom surface of the intermediate layer,
   wherein the first crack induction layer is configured to allow an impact to reach the first crack induction layer and to induce crack in the first crack induction layer.

2. The display device of claim 1, wherein the first crack induction layer does not overlap the thin film transistor as viewed from a direction perpendicular to the substrate.

3. The display device of claim 1, wherein the first crack induction layer comprises an inorganic insulating material.

4. The display device of claim 1, wherein the first crack induction layer has an island shape as viewed from a direction perpendicular to the substrate.

5. The display device of claim 1, wherein a bottom surface of the first organic insulating layer in a direction to the substrate, and a bottom surface of the first crack induction layer in the direction to the substrate are located on a same layer.

6. The display device of claim 1, wherein the thin film transistor comprises a first element and a second element located over the first element, and an inorganic insulating layer is arranged between the first element and the second element.

7. The display device of claim 6, wherein the first crack induction layer is located over the inorganic insulating layer, and the first organic insulating layer covers the inorganic insulating layer, the second element, and the first crack induction layer.

8. The display device of claim 6, wherein the first crack induction layer is located on a wiring arranged on the inorganic insulating layer, and the first organic insulating layer covers the inorganic insulating layer, the second element, the wiring and the first crack induction layer.

9. The display device of claim 8, wherein only an insulating material or insulating materials are arranged between the substrate and a portion of the wiring corresponding to the first crack induction layer.

10. The display device of claim 8, further comprising an organic material layer arranged between the first crack induction layer and the wiring.

11. The display device of claim 8, wherein the wiring and the second element comprise a same material, and strength of the second element is less than that of the first element.

12. The display device of claim 6, further comprising an additional inorganic insulating layer covering the inorganic insulating layer and the second element,
wherein the first crack induction layer is located over the additional inorganic insulating layer, and the first organic insulating layer covers the additional inorganic insulating layer and the first crack induction layer.

13. The display device of claim 6, wherein a distance from the substrate to a top surface of the first crack induction layer is greater than a distance from the substrate to a top surface of the second element.

14. The display device of claim 13, wherein the top surface of the second element is farthest from the substrate among top surfaces of elements of the thin film transistor.

15. A display device comprising:
a substrate having a display area;
a thin film transistor arranged over the substrate in the display area;
a first organic insulating layer arranged over the thin film transistor;
a pixel electrode located over the first organic insulating layer and electrically connected to the thin film transistor;
an intermediate layer located on the pixel electrode;
a first crack induction layer located inside the first organic insulating layer and in the display area, a width of an upper surface of the first crack induction layer being smaller than a width of a bottom surface of the intermediate layer;
a second organic insulating layer located on the first organic insulating layer to cover an edge of the pixel electrode; and
a second crack induction layer located inside the second organic insulating layer and being in direct contact with the second organic insulating layer.

16. The display device of claim 15, wherein the second crack induction layer does not overlap the thin film transistor as viewed from a direction perpendicular to the substrate.

17. The display device of claim 15, wherein at least a portion of the second crack induction layer overlaps the first crack induction layer as viewed from a direction perpendicular to the substrate.

18. The display device of claim 15, wherein the second crack induction layer comprises an inorganic insulating material.

19. The display device of claim 15, wherein the second crack induction layer has an island shape as viewed from a direction perpendicular to the substrate.

20. A display device comprising:
a substrate;
a thin film transistor arranged over the substrate;
a first organic insulating layer arranged over the thin film transistor;
a pixel electrode located over the first organic insulating layer and electrically connected to the thin film transistor;
a second organic insulating layer located on the first organic insulating layer to cover an edge of the pixel electrode; and
a crack induction layer located inside the second organic insulating layer and being in direct contact with the second organic insulating layer.

21. The display device of claim 20, wherein the crack induction layer does not overlap the thin film transistor as viewed from a direction perpendicular to the substrate.

22. The display device of claim 20, wherein the crack induction layer comprises an inorganic insulating material.

23. The display device of claim 20, wherein the crack induction layer has an island shape as viewed from a direction perpendicular to the substrate.

24. A display device comprising:
a substrate;
a pixel circuit arranged over the substrate, the pixel circuit comprising a thin film transistor and a capacitor;
an organic insulating layer arranged over the pixel circuit;
a crack induction layer located inside the organic insulating layer; and
an organic light-emitting diode arranged over the organic insulating layer and electrically connected to the pixel circuit,
wherein the crack induction layer does not overlap the thin film transistor and the capacitor as viewed from a direction perpendicular to the substrate, and
a distance from the substrate to a top surface of the crack induction layer is greater than a distance from the substrate to a top surface of the capacitor.

25. The display device of claim 24, wherein the crack induction layer comprises an inorganic insulating material.

* * * * *